(12) United States Patent
Gruppo et al.

(10) Patent No.: US 11,889,651 B2
(45) Date of Patent: Jan. 30, 2024

(54) RACK MOUNTABLE BRACKET

(71) Applicant: eBay Inc., San Jose, CA (US)

(72) Inventors: Christopher Dante Joseph Gruppo, Reno, NV (US); Joshua Sattler, Westminster, CO (US)

(73) Assignee: eBay Inc., San Jose, CA (US)

( * ) Notice: Subject to any disclaimer, the term of this patent is extended or adjusted under 35 U.S.C. 154(b) by 0 days.

(21) Appl. No.: 17/470,347

(22) Filed: Sep. 9, 2021

(65) Prior Publication Data
US 2023/0073674 A1 Mar. 9, 2023

(51) Int. Cl.
*H05K 7/00* (2006.01)
*H05K 7/14* (2006.01)

(52) U.S. Cl.
CPC ......... *H05K 7/1489* (2013.01); *H05K 7/1404* (2013.01)

(58) Field of Classification Search
None
See application file for complete search history.

(56) References Cited

U.S. PATENT DOCUMENTS

| | | |
|---|---|---|
| D45,918 S | 6/1914 | Strong |
| D46,297 S | 8/1914 | Smith |
| D160,028 S | 9/1950 | Spencer |
| D198,318 S | 6/1964 | Grasso |
| D233,017 S | 10/1974 | Hall |
| D251,343 S | 3/1979 | Hansen |
| D252,787 S | 9/1979 | Jefferson |
| D280,595 S | 9/1985 | Wilk |
| D284,932 S | 8/1986 | Beverly |
| D285,410 S | 9/1986 | Webber |
| D300,301 S | 3/1989 | Furst |
| D324,784 S | 3/1992 | Rose |
| D327,839 S | 7/1992 | Stumpf et al. |
| D335,815 S | 5/1993 | Sachs |
| D353,535 S | 12/1994 | Grittman et al. |

(Continued)

OTHER PUBLICATIONS

IBM Documentation, "Installing Devices vertically in the Rack Cabinet", Retrieved from the Internet URL :<https://www.ibm.com/docs/en/power9/9008-22L?topic=devices-installing-vertically-in-rack-cabinet>, Accessed on Nov. 29, 2021, 1 page.

(Continued)

*Primary Examiner* — Anthony Q Edwards
*Assistant Examiner* — Rashen E Morrison
(74) *Attorney, Agent, or Firm* — FIG. 1 Patents

(57) ABSTRACT

A rack mountable bracket is described. The bracket is mountable to a rack configured for mounting equipment. The rack is also configured according to a rack standard (e.g., EIA-310) that specifies how rails of the rack are disposed, one rail to another, and how a strip of holes disposed along a length of each rail is spaced, one hole to another. In one or more implementations, the bracket includes a pair of mounting edges for mounting the bracket to a mounting pair of the rails using hole strips of the mounting pair of rails. The bracket also includes an equipment mounting rail having a hole strip disposed along a length of the rail with holes spaced according to the rack standard. The equipment mounting rail is disposed between the mounting edges, such that when the bracket is mounted to the mounting pair of rails the bracket is horizontally oriented.

20 Claims, 35 Drawing Sheets

(56) References Cited

U.S. PATENT DOCUMENTS

| | | |
|---|---|---|
| D381,967 S | 8/1997 | Tatsumi |
| D411,738 S | 6/1999 | Raasch et al. |
| 6,095,345 A * | 8/2000 | Gibbons ............... H05K 7/1489 361/829 |
| D437,945 S | 2/2001 | Mast et al. |
| D478,804 S | 8/2003 | Titus |
| D488,373 S | 4/2004 | Eberle |
| D494,045 S | 8/2004 | Van Essen et al. |
| 6,804,923 B1 | 10/2004 | Potter |
| D517,402 S | 3/2006 | Cairns |
| 7,052,200 B2 | 5/2006 | Harris |
| D543,834 S | 6/2007 | Worthy |
| D551,538 S | 9/2007 | Pearce |
| D562,119 S | 2/2008 | Prichard, Jr. et al. |
| D568,147 S | 5/2008 | Prichard, Jr. et al. |
| D583,223 S | 12/2008 | Bunn |
| 7,578,105 B2 | 8/2009 | Eberle, III |
| D605,931 S | 12/2009 | Piersant |
| D605,932 S | 12/2009 | Piersant |
| D666,898 S | 9/2012 | McMahon |
| D690,188 S | 9/2013 | Pontus |
| D730,720 S | 6/2015 | Nowak |
| 9,145,673 B1 | 9/2015 | Dantzer |
| D742,726 S | 11/2015 | Glass et al. |
| D754,405 S | 4/2016 | Herde |
| D769,698 S | 10/2016 | Oltrogge |
| D787,899 S | 5/2017 | Lannan |
| D805,880 S | 12/2017 | Bright et al. |
| D810,546 S | 2/2018 | Shaw et al. |
| D816,466 S | 5/2018 | Gomez |
| 10,174,496 B2 | 1/2019 | Bertato |
| D846,372 S | 4/2019 | Wu |
| D850,245 S | 6/2019 | Brigh et al. |
| D867,112 S | 11/2019 | Taylor |
| D891,912 S | 8/2020 | Underwood |
| 11,085,485 B1 | 8/2021 | Toal et al. |
| 2004/0183409 A1 * | 9/2004 | Rinderer ............... H05K 7/1421 312/265.4 |
| 2005/0173357 A1 * | 8/2005 | McClain ............... H05K 7/1494 211/26 |
| 2008/0231151 A1 * | 9/2008 | Barringer ............... G06F 1/182 29/428 |
| 2014/0263129 A1 * | 9/2014 | Tseng ............... H05K 7/1488 211/182 |
| 2015/0090679 A1 * | 4/2015 | Obernesser ......... A61M 31/007 211/26 |
| 2015/0136714 A1 * | 5/2015 | Franklin ............... H05K 7/18 211/26 |
| 2015/0302400 A1 | 10/2015 | Metral |

OTHER PUBLICATIONS

U.S. Appl. No. 29/807,146 , "Ex Parte Quayle Action", U.S. Appl. No. 29/807,146, filed May 16, 2023, 5 pages.

U.S. Appl. No. 29/807,146, , "Non-Final Office Action", U.S. Appl. No. 29/807,146, filed Feb. 24, 2023, 7 pages.

U.S. Appl. No. 29/807,146, , "Restriction Requirement", U.S. Appl. No. 29/807,146, filed Jan. 9, 2023, 6 pages.

ECHOGEAR, , "ECHOGEAR Rack Compatible Swing-Out Wall Mount—Compatible with 10U, 15U, & 20U Open Frame Racks", Listed by ECHOGEAR on amazon.com [retrieved Feb. 24, 2023]. Retrieved from the Internet <https://www.amazon.com/dp/B07ZHJPGXS/ref=emc_bcc_2_i>, 1 page.

Jingchengmei, , "Jingchengmei 2 Pack 1U Metal Disassembled Blank Panel 1U Rack Mount Spacer for 19in Server Rack Enclosure or Network Cabinet, Black (ABPA2PC)", Listed by Jingchengmei on Amazon.com [retrieved Feb. 24, 2023]. Retrieved from the Internet <https://www.amazon.com/Jingchengmei-Disassembled-Enclosure-Network-Cabinet/dp/B088698XG9>, 1 page.

Startech, , "StarTech.com 1U Blanking Panel—Metal Rack Mount Filler Panel—for 19in Server Rack Enclosure or Cabinet—Steel—Black (BLANKB1)", Listed by StarTech on Amazon.com [retrieved Feb. 24, 2023]. Retrieved from the Internet <https://www.amazon.com/dp/B003AVPUWY?th=1>, 1 page.

Yap, Jules , "Rast Transformed in a 19-Inch Rack Mount", ikeahackers. net [retrieved Feb. 24, 2023]. Retrieved from the Internet <https://ikeahackers.net/2012/05/rast-transformed-in-a-19-inch-rack-mount.html>, May 12, 2012, 11 pages.

* cited by examiner

2000 →

2100 →

3200

3300

3400

3500

3600

RACK MOUNTABLE BRACKET

BACKGROUND

Racks for mounting computing equipment, such as servers, networking switches, firewalls, and patch panels, are often configured according to a standard, such as Electronic Industries Association's EIA-310. A rack configured in this way may be commonly referred to as a "standard rack" or a "19-inch rack." The standardization of racks allows organizations to reliably plan layouts for facilities (e.g., data centers and/or server farms), designed and built to house vast numbers of racks, such that a number and arrangement of racks can be planned for a known amount of space. The standardization also provides a guide for equipment manufacturers to manufacture computing equipment so that it can be integrated easily with existing solutions and so that organizations can reliably plan how racks are loaded with the equipment.

Due to advances in computing technology, such as those that enable computing equipment to store greater amounts of data in smaller form factors, perform computations faster, and transfer more data at higher speed, standard racks may not be optimized to handle some of the impacts of modern computing equipment, such as increased cable widths and heat production. Moreover, standard racks may not be optimized to handle those impacts while also maintaining the advantages of standardized rack configuration, including replaceability and accessibility.

SUMMARY

To overcome these problems, a rack mountable bracket is leveraged. In accordance with the described techniques, the bracket is mountable to a rack configured for mounting equipment. This rack, to which the bracket can be mounted, is configured according to a rack standard (e.g., EIA-310) that specifies how rails of the rack are disposed, one rail to another, and how a strip of holes disposed along a length of each rail is spaced, one hole to another. In one or more implementations, the bracket includes a pair of mounting edges for mounting the bracket to a mounting pair of the rails by using hole strips of the mounting pair of rails. The bracket also includes an equipment mounting rail, which has a hole strip disposed along a length of the rail with holes spaced according to the rack standard. The equipment mounting rail is disposed between the mounting edges, such that when the bracket is mounted to the mounting pair of rails, the bracket is oriented horizontally in relation to the ground. This horizontal orientation of the bracket enables equipment (e.g., servers, networking switches, firewalls, patch panels, telecommunications equipment, audiovisual production gear, and scientific equipment) to be mounted to the hole strip of the bracket so that the equipment is oriented vertically in relation to the ground.

This Summary introduces a selection of concepts in a simplified form that are further described below in the Detailed Description. As such, this Summary is not intended to identify essential features of the claimed subject matter, nor is it intended to be used as an aid in determining the scope of the claimed subject matter.

BRIEF DESCRIPTION OF THE DRAWINGS

The detailed description is described with reference to the accompanying figures.

DETAILED DESCRIPTION

Overview

Figure 1:
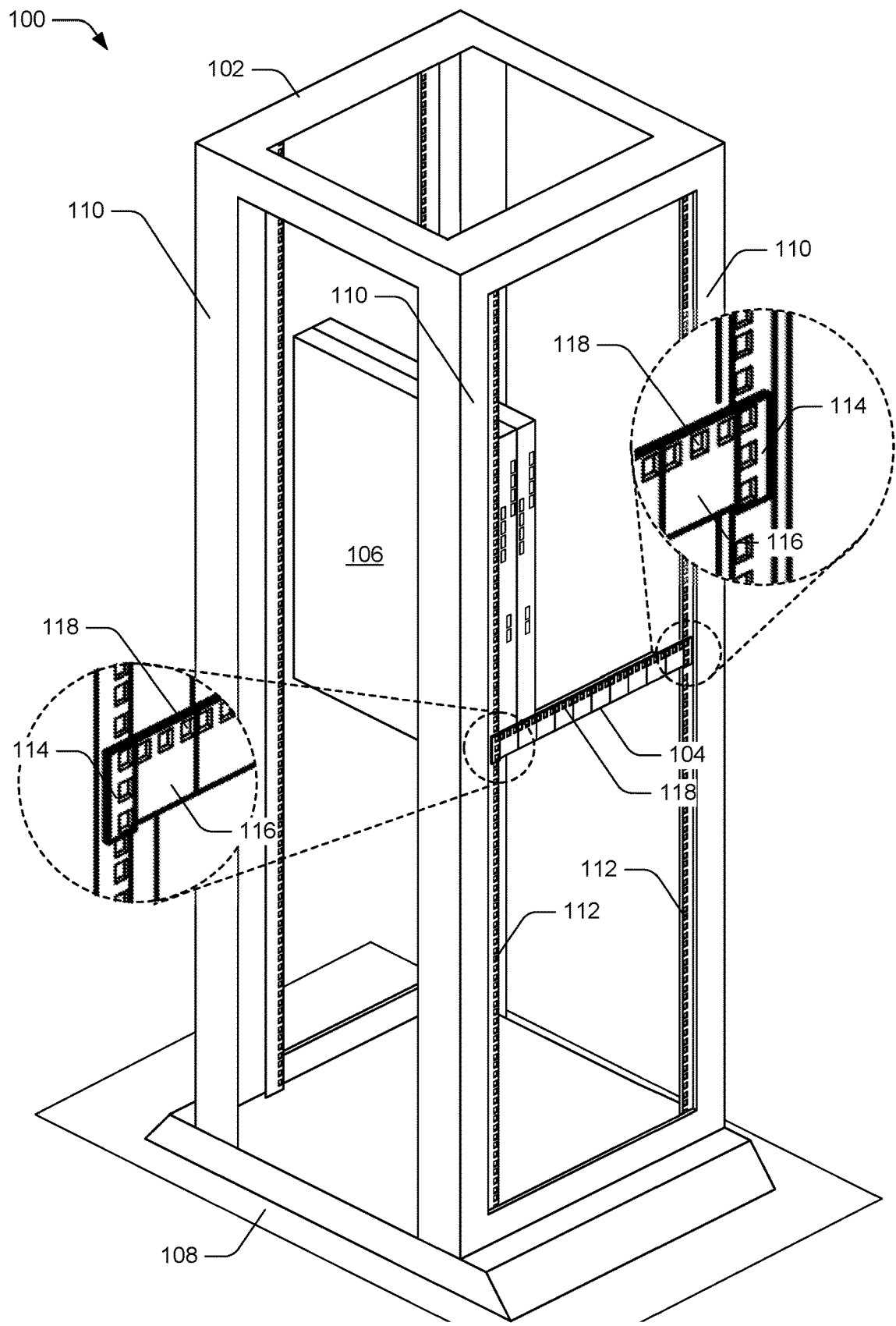
FIG. 1 is an illustration of an environment in an example implementation that is operable to employ a rack mountable bracket described herein.

Racks for mounting computing equipment, such as servers, networking switches, firewalls, and patch panels, are often configured according to a standard, such as Electronic Industries Association's EIA-310. A rack configured in this way may be commonly referred to as a "standard rack" or a "19-inch rack." When deployed, standard racks are generally configured so that equipment mounted to those racks (i.e., "rack mounted equipment") is oriented horizontally in relation to the ground. In other words, the equipment mounts to a standard rack such that devices can be stacked one device on top of another. When equipment is loaded onto a standard rack in this way, some cables for the equipment may be run along or outside the rack. However, running relatively thick cables outside or along a standard rack, may prevent the rack from being positioned directly against one or more other racks, e.g., in an arrangement of multiple racks. Consequently, standard racks with too many thick cables running along or outside of them may take up more space than standard racks arranged so that they substantially touch one another.

To overcome these problems, a rack mountable bracket is leveraged. In accordance with the described techniques, the bracket is mountable to a rack that is configured for mounting equipment and is configured according to a rack standard, such as EIA 310. The rack mountable bracket enables computing equipment to be mounted in a vertical—rather than horizontal orientation. In other words, the rack mountable bracket enables computing equipment to be mounted to the bracket such that the equipment is arranged side-by-side (e.g., like books on a shelf) rather than stacked one device on top of another. This side-by-side orientation enables cables to be run between mounted equipment and also within the standard rack, rather than being run along or outside the rails of the rack.

In one or more implementations, the bracket includes a pair of mounting edges for mounting the bracket to a pair of mounting rails of a standard rack, e.g., using hole strips of those rails having holes spaced according to the rack standard. Broadly speaking, the mounting edges of the bracket may be configured like "ears" or "tabs" that protrude from rack mounted equipment, enabling such equipment to be mounted directly to standard racks. The bracket also includes an equipment mounting rail. The equipment mounting rail has a hole strip disposed along a length of the rail with holes that are also spaced according to the rack standard. In accordance with the described techniques, the equipment mounting rail is disposed between the mounting edges of the bracket, such that when the bracket is mounted to a mounting pair of rails, the equipment mounting rail is oriented horizontally in relation to the ground. In this way, an axis that corresponds to the mounting rail's hole strip (e.g., that runs along a length of the hole strip) is substantially perpendicular to longitudinal axes of the pair of mounting rails.

This horizontal orientation of the bracket's equipment mounting rail enables equipment (e.g., servers, networking switches, firewalls, patch panels, telecommunications equipment, audiovisual production gear, and scientific equipment) to be mounted to the hole strip of the bracket so that the equipment is oriented vertically in relation to the ground. Given this, an axis that extends across a front panel of a piece of equipment (e.g., from one ear or tab of the equipment to a corresponding ear or tab on the other side of the equipment) is substantially parallel to the longitudinal axes of the pair of mounting rails.

When mounted to the bracket using the equipment mounting rail, though, computing equipment and the bracket may consume more vertical space than mounting the equipment directly to the rack. Consider the 19-inch EIA-310 standard, for instance, which specifies a rack opening width, e.g., a distance between inside edges of a mounting pair of rails. When configured based on this standard, the equipment mounting rail, which spans the distance between the mounting pair of rails, can only include ten units (10U) of holes configured according to the rack standard—there is not enough space between the mounting rails for the bracket's hole strip to include an eleventh unit of holes configured according to the rack standard. Accordingly, rack mounted equipment configured for mounting directly to 10U of rack standard holes can be mounted to the equipment mounting rail in this scenario. However, this equipment and the bracket may consume more vertical space, e.g., approximately 12U of vertical space, than if the equipment is mounted directly to the rack.

For the sake of comparison, mounting 10U of rack mounted equipment, directly to 10U of holes of a rack's hole strips, consumes approximately 10U of vertical space, whereas mounting the same 10U of rack mounted equipment to the equipment mounting rail may consume up to approximately 12U of vertical space. This is in part because the rack standard may specify that equipment manufactured according to the standard is to have a front panel that spans 19-inches, including the ears or tabs that protrude from the equipment enabling it to mount to a standard rack. Thus, the front panel of the equipment with the mounting ears or tabs has a width that extends beyond the 10U worth of space between the mounting pair of rails. Without being mounted, for instance, a front panel of the equipment may have a width between 10U and 12U.

Although a portion of the ears or tabs may overlap with the bracket when mounted, the mounting edges and the equipment mounting rail of the bracket discussed herein nevertheless consume vertical space. For example, the mounting edges and the equipment mounting rail may have a height of approximately 1U, although their heights may be greater or lesser in different implementations. Additionally, the rack mounted equipment may be mounted to a first and a second bracket, such that the rack mounted equipment is mounted simultaneously to both the first and the second brackets. For example, a first ear of the rack mounted equipment may be mounted to the first bracket and a second ear of the rack mounted equipment may be mounted simultaneously to the second bracket.

Despite consuming more vertical space than mounting rack mounted equipment directly to a standard rack, mounting rack mounted equipment to the bracket described above and below has a variety of advantages over conventional techniques. For example, when the same pieces of equipment (e.g., the same model of network switches) are mounted vertically using the bracket, cables that are connected to those side-by-side pieces of equipment and bundled together to run through a same space in the rack may be bent with a substantially similar radius to run through that space. Using conventional mounting approaches, though, where equipment is mounted one piece on top of another, cables that are connected to adjacent pieces of equipment (e.g., one on top of another) and bundled together to run through a same space in the rack will be bent with different radii. Consider a scenario where the space, through which bundled cables of a stack of equipment are run, is above the stack. Using conventional mounting techniques, the cable running from a top piece of equipment in the stack will be bent at a smaller radius than the cable running from a bottom piece of equipment in the stack. However, the smaller radius with which the top cable is bent may only allow certain cables to be used, e.g., thinner cables. Thicker cables, capable of handling larger amounts of data transmission, may not be capable of bending at the smaller radius without degrading performance or breaking. As such, conventional mounting techniques may not support as widespread use of thicker cables as mounting computing equipment to the described bracket. Due to the vertical arrangement of equipment mounted to the described bracket and the thicker cables, the bracket enables bundles of the cables to be moved away from the front of computing devices, allowing better airflow and cooling of the equipment.

Moreover, by enabling such cables to be run within standard racks, rather than outside them, the bracket maintains the replaceability and accessibility advantages of standardized rack configuration. In an arrangement of standard racks, for instance, the bracket enables the racks to be arranged such that they substantially contact one another, saving space in facilities housing numerous racks. Given such an arrangement, the bracket also enables a given rack loaded with equipment to be easily swapped with a different rack loaded with equipment.

In the following discussion, an example environment is first described that may employ the rack mountable bracket described herein. Example implementation details and procedures are then described.

Example Environment and Example Rack Standard

FIG. 1 is an illustration of an environment 100 in an example implementation that is operable to employ a rack mountable bracket as described herein.

The illustrated environment 100 includes a rack 102, a bracket 104, and rack mounted equipment 106. In this example, the bracket 104 is mounted directly to the rack 102 and the rack mounted equipment 106 is mounted to the bracket 104, rather than being mounted directly to the rack 102 as with conventional equipment mounting approaches. In contrast to conventional equipment mounting approaches, which involve mounting equipment directly to the rack 102 and in which mounted equipment is oriented horizontally in relation to ground 108, the rack mounted equipment 106 is oriented vertically in relation to the ground 108 when mounted to the bracket 104.

Here, the rack 102 is configured according to a rack standard, such as Electronic Industries Association's EIA-310. A rack configured in this way may be referred to commonly as a "standard rack" or a "19-inch rack." Broadly speaking, the rack standard specifies how rails 110 of the rack 102 are disposed, one rail 110 relative to another. The rack standard also specifies how a strip of holes disposed along a length of each rail 110 is spaced, one hole relative to another. In accordance with the described techniques, the rails 110 of the rack 102 include hole strips 112. For instance, each of the rails 110 includes a respective hole strip 112. Broadly speaking, these hole strips 112 are useable to mount rack mounted equipment. In addition to specifying the spacing between holes of a given strip, the rack standard specifies how corresponding holes of a first rail and a second rail are spaced relative to one another, where the first and second rail form a "mounting pair" of the rails 110. One example of rack-standard hole spacing is discussed in detail in relation to FIG. 2.

As used herein, the term "mounting pair" of rails refers to a pair of the rails 110 to which a piece of rack mounted equipment (e.g., the rack mounted equipment 106) is configured to be mounted. In particular, the hole strips 112 of a mounting pair of the rails 110 are useable to mount rack mounted equipment. In accordance with the described techniques, the rack 102 may include two mounting pairs of rails, which may be referred to as a "front" mounting pair of rails and a "back" mounting pair of rails. Although a rack standard for a 19-inch rack is discussed herein, it is to be appreciated that the rack 102 may be configured according to different rack standards, that specify how the rails 110 are disposed and specify spacing of holes of the hole strips 112, without departing from the spirit or scope of the described techniques.

In general, rack mounted equipment can be mounted to a rack using mounting edges of the equipment. Such mounting edges may be commonly referred to as "ears" or "tabs" that protrude from the equipment. For example, a first "ear" or "tab" protrudes from a left side of a piece of equipment (where left is in relation to a front panel of the equipment), and a second "ear" or "tab" protrudes from a right side of the piece of equipment (where right is in relation to the front panel of the equipment). Further, rack mounted equipment may be mounted to the rack with fasteners, e.g., screws, that extend through holes of the equipment's "ears" or "tabs" and also through holes in the rack's rails. It is to be appreciated that fasteners other than screws may be used and/or that the ears may include portions of fasteners (e.g., welded to or otherwise integral with the ears) that enable the equipment to be mounted to the rack's holes without departing from the spirit or scope of the described techniques.

Often, rack mounted equipment is fastened to a number of "units" worth of holes, e.g., 1-unit (1U) worth of holes, 2-units (2U) worth of holes, 3-units (3U) worth of holes, and so forth. Given the EIA-310 rack standard, discussed in more detail below, a unit corresponds to three holes of a strip configured according to the standard. With this, the number of units of holes that a piece of equipment's ears mount to substantially corresponds to a height of the piece of equipment. For instance, in a scenario where a piece of equipment's ears span 1U of the rack's holes, the piece of equipment may have a height of substantially 1U.

Additionally, rack mounted equipment is generally mounted to corresponding holes of a mounting pair of the rails 110. By way of example, a piece of rack mounted equipment that mounts to 1U-worth of the hole strips 112's holes may be mounted a number of units from a base or top of the rack 102, e.g., the piece of equipment may be mounted 5U up from a base of the rack 102. In the scenario where the piece of equipment is mounted 5U from the base of the rack 102, there are 4U of holes between the holes to which that piece of equipment's ears are mounted and the base of the rack. Given this particular scenario, the holes of the fifth unit in a first of the rails to which the piece of equipment is mounted "correspond" to the holes of the fifth unit in a second of the rails to which the piece of equipment is mounted. In conventional approaches, rack mounted equipment is mounted directly to the hole strips 112 of the rails 110 such that the rack mounted equipment is oriented horizontally in relation to the ground 108, and thus perpendicularly in relation to longitudinal axes of the rails 110.

In accordance with the described techniques, the bracket 104 includes mounting edges 114, which correspond to "ears" or "tabs" of the bracket 104 and enable the bracket 104 to be mounted directly to the rack 102, e.g., like rack mounted equipment is able to be mounted directly to the rack 102. In one or more implementations, each of the mounting edges 114 is configured to be mounted using 1U of corresponding holes of the hole strips 112 in a mounting pair of the rails 110, e.g., the front rails 110. Alternatively, each of the mounting edges 114 of the bracket 104 may be configured to be mounted using more than 1U of corresponding holes of the hole strips 112, an example of which is depicted in FIGS. 14-21 below.

Although only a single bracket 104 is depicted in the illustrated example 100, it is to be appreciated that more than one bracket may be used to mount one or more pieces of the computing equipment 106. For example, a second, top bracket 104 may be mounted to the same pair of mounting rails 110 as the depicted bracket 104 is mounted to. The computing equipment 106 may thus be mounted simultaneously to the pair of brackets 104 mounted to the "front" mounting rails 110, e.g., to the bottom bracket 104 and the top bracket 104 (which is not depicted in this example). Examples of mounting a pair of brackets to a front pair of mounting rails 110, so that equipment can be mounted simultaneously to the pair of brackets, include the examples depicted in FIGS. 4 and 5, below.

Alternatively or additionally, a pair of brackets 104 may be mounted such that a first bracket 104 is mounted to a front mounting pair of rails 110 as depicted and such that a second bracket 104 is mounted to a back mounting pair of rails 110. By way of example, the second bracket 104 may also be mounted below the equipment to support a load of the equipment resting on both the brackets 104. The use of both the first and second brackets also accommodates computing equipment 106 that uses mounting rails for mounting rather than just rack ears/tabs. Switches and servers having a longer (e.g., deeper) form factor that need rear support may use rails in a 4-post rack rather than just front tabs.

Rather than being mounted to the brackets 104 so that the computing equipment rests "on top" of the brackets 104, the computing equipment 106 may be mounted to hang from a pair of brackets where the first bracket 104 is mounted to the front pair of rails 110 and the second bracket is mounted to the back pair of rails 110. It is to be appreciated that in operation the computing equipment 106 may be mounted to more than two brackets 104, in one or more scenarios. For example, the computing equipment 106 may be mounted to four brackets in one or more scenarios, such that the computing equipment 106 is mounted to a first pair of the brackets 104 (e.g., top and bottom) that are mounted to the front pair of mounting rails 110 of the rack 102 and such that the computing equipment 106 is also simultaneously mounted to a second pair of the brackets 110 (e.g., top and bottom) that are mounted to the back pair of mounting rails 110 of the rack 102.

Figure 22:
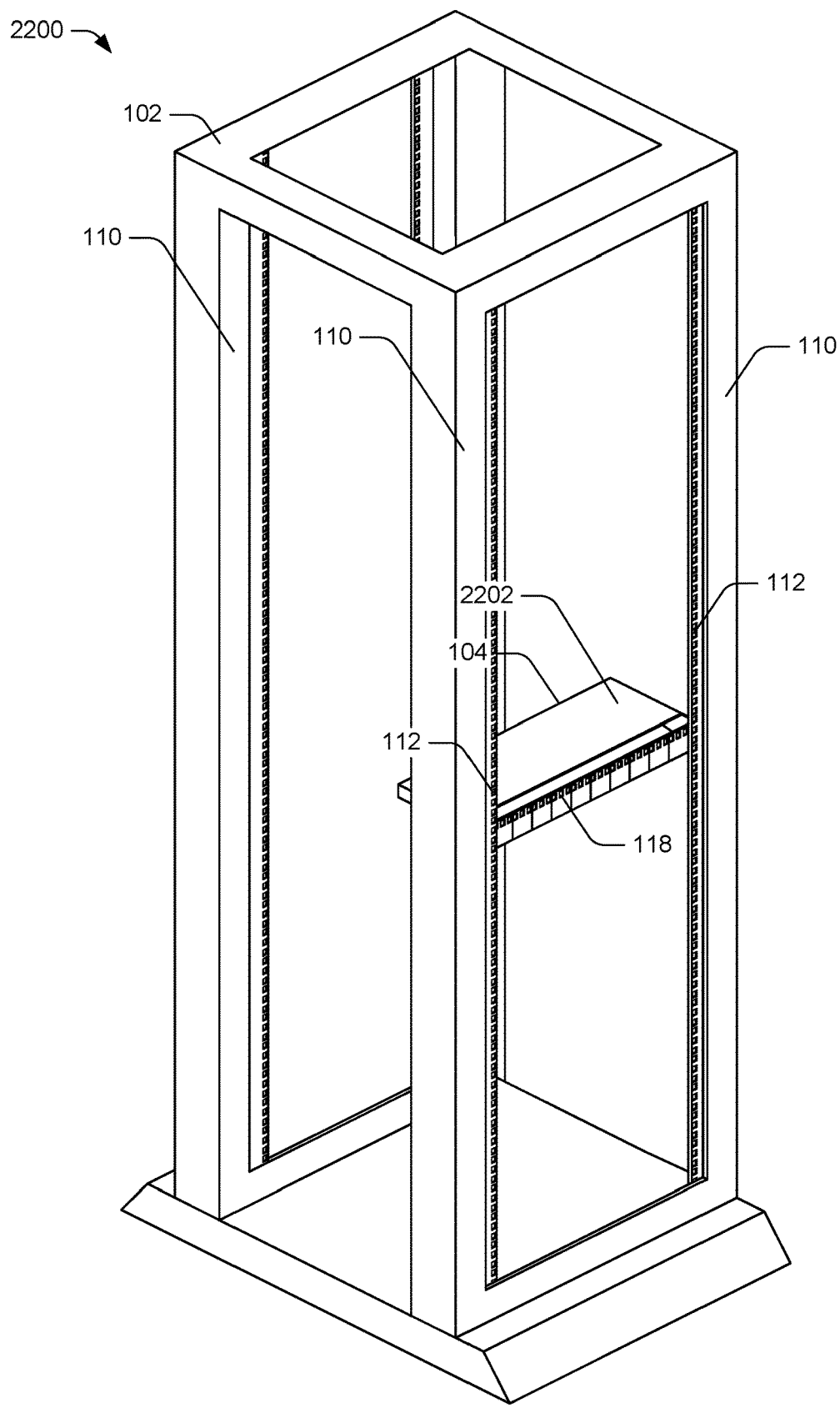
FIG. 22 depicts a third example implementation of a bracket mounted to a rack configured according to a rack standard.
Figure 30:
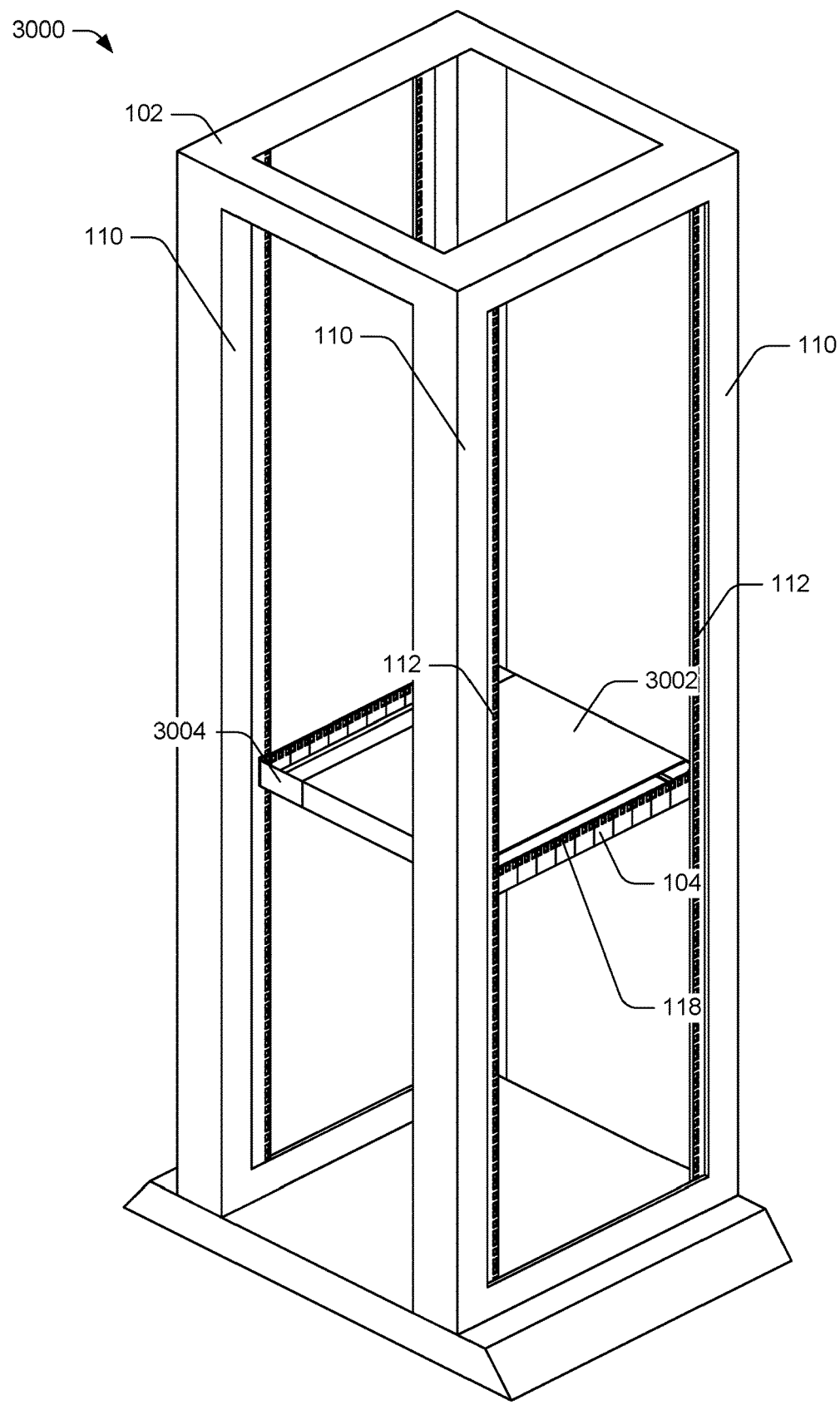
FIG. 30 depicts a fourth example implementation of a bracket mounted to a rack configured according to a rack standard.
Figure 38:
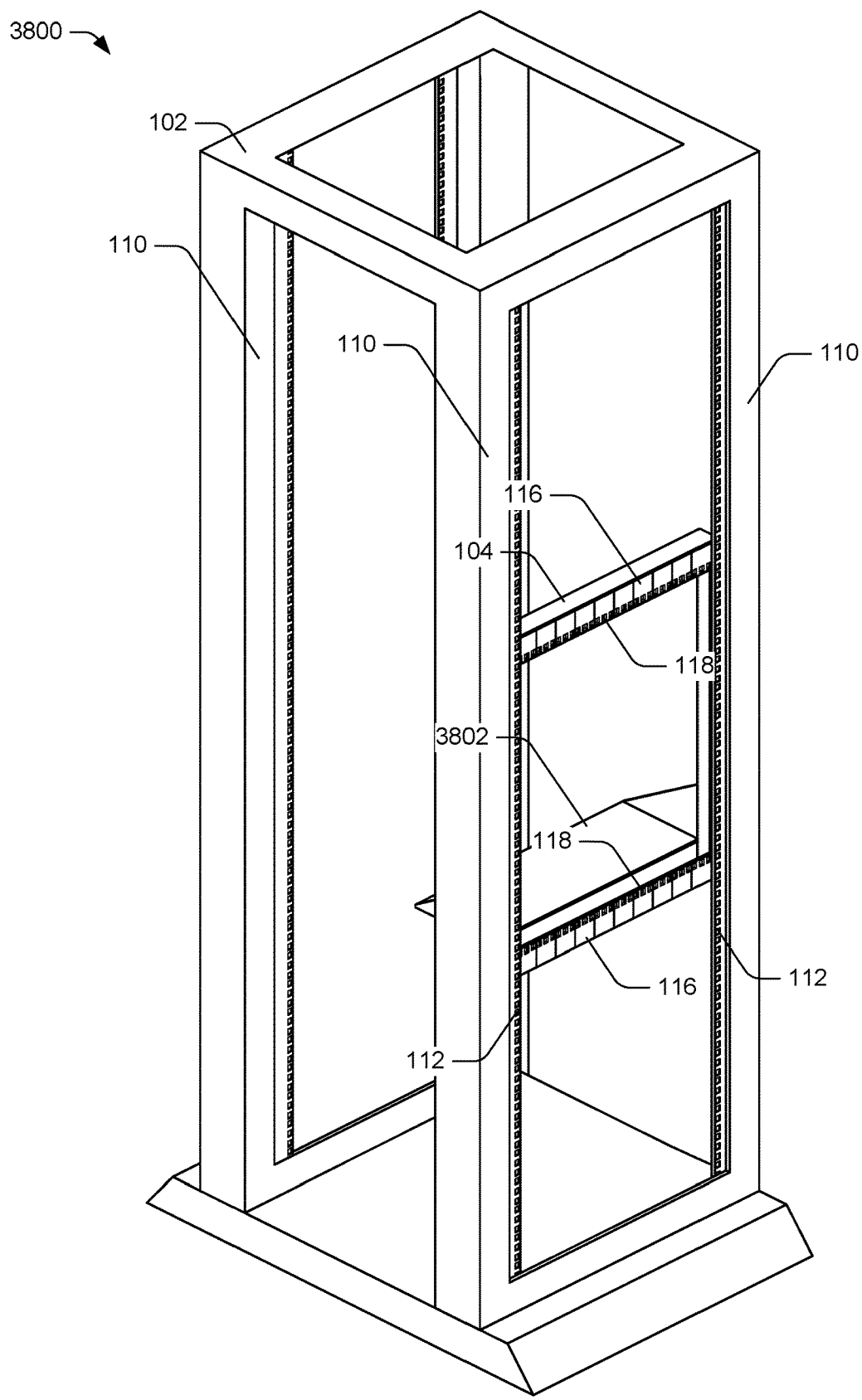
FIG. 38 depicts a fifth example implementation of a bracket mounted to a rack configured according to a rack standard.

In one or more implementations, the mounting edges 114 are configured to mount the bracket 104 via the hole strips 112 such that the mounting edges 114 contact an outside of the rack 102 (as depicted in the environment 100)—the mounting edges 114 are disposed on an outside-of-the-rack portion of the rails 110. Alternatively, the mounting edges 114 of the bracket 104 may be configured to mount the bracket 104 via the hole strips 112 such that the mounting edges 114 contact an inside of the rack (as depicted in FIGS. 22, 30, and 38)—the mounting edges 114 are disposed on an inside-of-the-rack portion of the rails 110. Further still, the mounting edges 114 may be configured to mount the bracket 104 interchangeably to an "outside" portion or an "inside" portion of the rails 110. In other words, the bracket 104 may be mounted to an inside portion of the rails 110 via the hole strips 112, removed, and then mounted to an outside portion of the rails 110 via the hole strips—or vice versa.

Between the mounting edges 114, the bracket 104 includes equipment mounting rail 116. The mounting edges 114 extend from the equipment mounting rail 116 such that the equipment mounting rail 116 is disposed between the bracket 104's mounting edges 114. In accordance with the described techniques, the equipment mounting rail 116 includes a hole strip 118, which, like the hole strips 112 of the rails 110 is configured according to the rack standard, e.g., EIA-310. When the bracket 104 is mounted to a mounting pair of the rails 110, as depicted, an axis extending across a length of the equipment mounting rail 116's hole strip 118 is substantially perpendicular to longitudinal axes of the rails 110, including the longitudinal axes of the mounting pair of rails 110 to which the bracket 104 is mounted. In operation, e.g., when the rack 102 is standing vertically on the ground 108 to support mounted equipment, the axis extending the length of the hole strip 118 is oriented substantially horizontally, and longitudinal axes of the rails 110 are oriented substantially vertically.

In accordance with the described techniques, the rack mounted equipment 106 is mounted to the equipment mounting rail 116 using the holes of the hole strip 118. By mounting to the holes of the hole strip 118, rather than the holes of the hole strips 112 of the rails 110, the rack mounted equipment 106 is oriented substantially vertically when mounted. This contrasts with mounting rack mounted equipment directly to the rails 110 via the hole strips 112, which causes the rack mounted equipment to be oriented substantially horizontally. Using such conventional mounting techniques, rack mounted equipment mounts to a standard rack such that pieces of the equipment can be stacked one device on top of another. In contrast, when rack mounted equipment is mounted to the equipment mounting rail 116 using the hole strip 118, the pieces of the equipment can be arranged side-by-side, e.g., like books on a shelf.

Notably, mounting rack mounted equipment to the equipment mounting rail 116 using the hole strip 118 consumes more space (e.g., units of the hole strips 112) than mounting a same amount of rack mounted equipment directly to the rails 110 using the hole strips 112. This is because the bracket 104, when mounted to the rails 110, consumes space that would be available for mounting equipment directly to the rails 110 were conventional techniques used, e.g., without the bracket 104 and such that the ears of the rack mounted equipment are used to mount the equipment directly to the rails 110. The ears of the rack mounted equipment also consume vertical space whereas, when the equipment is mounted conventionally, those ears are in front of or behind the respective rails 110.

Given the 19-inch, EIA-310 standard, for instance, the equipment mounting rail 116 can include ten units (10U) of holes configured according to the standard—there is not enough width between the rails 110 for the hole strip 118 to include an eleventh unit of the holes when those holes and the rack 102 are configured according to the example rack standard. Accordingly, rack mounted equipment configured for mounting directly to 10U of rack standard holes can be mounted to the equipment mounting rail 116 in this scenario. When mounted to the equipment mounting rail 116, though, this equipment and the bracket 104 consume more vertical space, e.g., approximately 12U of vertical space.

For the sake of comparison, mounting 10U of rack mounted equipment, directly to 10U of the holes of the hole strips 112, consumes approximately 10U of vertical space, whereas mounting the same 10U of rack mounted equipment to the equipment mounting rail 116 may consume up to approximately 12U of vertical space. This is in part because the example rack standard may specify that equipment manufactured according to the standard is to have a front panel that spans 19-inches, which is to include the ears or tabs that protrude from the equipment enabling it to mount to the standard rack. Thus, the front panel of the equipment with the mounting ears or tabs has a width that extends beyond the 10U worth of space between the mounting pair of rails. Without being mounted, for instance, a front panel of the equipment by itself may have a width between 10U and 12U. Although a portion of the ears or tabs may overlap with the bracket 104 when mounted, the mounting edges 114 and the equipment mounting rail 116 also consume vertical space. For example, the mounting edges 114 and the equipment mounting rail 116 may have a height of approximately 1U—although the height may be more or less in different implementations. Additionally, although the rack mounted equipment 106 is depicted being mounted to a single, bottom bracket 104 in the illustrated example, it is to be appreciated that a second bracket 104 may be mounted above the depicted bracket 104, such that the rack mounted equipment 106 is mounted simultaneously to both the first and the second brackets. For example, a first ear of the rack mounted equipment 106 may be mounted to the first bracket and a second ear of the rack mounted equipment 106 may be mounted simultaneously to the second bracket. An example of using two brackets, each mounted directly to the rails 110 using the hole strips 112 of the rails 110 is depicted in more detail below in relation to FIG. 4. Consider now the following discussion of an example rack standard, namely, the Electronic Industries Association's (EIA's) EIA-310 standard for racks.

Figure 2:
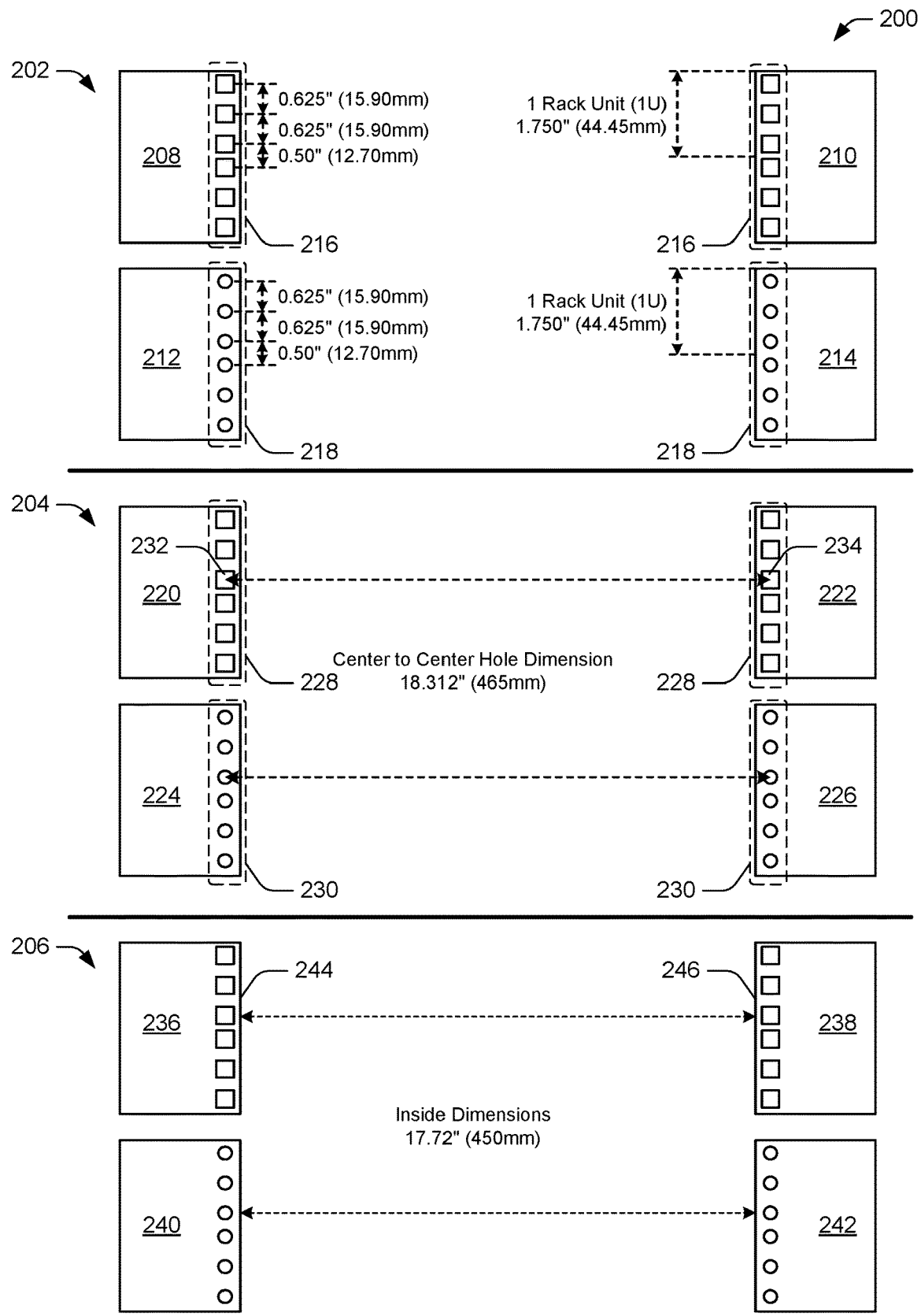
FIG. 2 depicts an example of hole spacing according to a rack standard.

FIG. 2 depicts an example 200 of hole spacing according to a rack standard.

In accordance with the described techniques, the rack standard specifies how the rails 110 of the rack 102 are disposed, one rail in relation to another, and how holes of the hole strips 112 are spaced. For example, the rack standard may specify vertical hole spacing (e.g., spacing between the holes of a hole strip), horizontal hole spacing (e.g., spacing between corresponding holes of a mounting pair of rails), rack opening width, and front panel width. In the following discussion, a rack standard issued by the Electronic Industries Association (EIA) for "19-inch" racks is described, i.e., EIA-310. It is to be appreciated, however, that the rack 102 and the hole strip 118 of the equipment mounting rail 116 may be configured according to different rack standards within the spirit of the described techniques.

The illustrated example 200 includes first rail segments 202, second rail segments 204, and third rail segments 206. In the following discussion, vertical hole spacing of the example rack standard is described in relation to the first rail segments 202, horizontal hole spacing of the example rack standard is described in relation to the second rail segments 204, and rack opening width of the example rack standard is described in relation to the third rail segments 206. It is to be appreciated that the rail segments and hole spacing in the illustrated example may not be drawn to scale and that those segments may depict mere portions of rails (rather than an entire span of rail) without departing from the spirit or scope of the described techniques. Notably, the first rail segments 202, the second rail segments 204, and the third rail segments 206 are each depicted including a pair of rail segments with rectangular (e.g., square) holes and a pair of rail segments with round (e.g., circular or ellipse-shaped) holes. To this end, the rails of a standard rack and the bracket 104 may include hole strips having holes shaped in these ways or shaped differently in accordance with the described techniques.

The first rail segments 202 include segment 208, segment 210, segment 212, and segment 214. In this example, the segment 208 and the segment 210 include rectangular holes 216. By way of contrast, the segment 212 and the segment 214 have circular holes 218. In connection with the example rack standard, vertical hole spacing is defined as a repeating pattern of holes within one rack unit. The segment 210 and the segment 214 depict specification of a rack unit according to the example rack standard. In particular, the example rack standard defines that a rack unit includes three holes and has a length of approximately 1.750 inches (44.45 millimeters).

The segment 208 and the segment 212 depict spacing between the holes, e.g., between adjacent holes. In particular, the example rack standard defines that the holes are spaced at 0.625 inches (15.90 millimeters) between a first hole and second hole of a unit, 0.625 inches (15.90 millimeters) between the second hole and a third hole of the unit, and 0.50 inches (12.70 millimeters) between the third hole of the unit and a first hole of an adjacent unit (where the third hole of the unit and the first hole of the adjacent unit are adjacent holes in a hole strip). Additionally, the start and stop of the "unit" length (e.g., the 1.750 inches) is in the middle of the holes spaced by 0.50 inches. The shared start and stop point bisects the space between the holes that are spaced by 0.50 inches. In accordance with the example rack standard, the distances between the holes (e.g., the 0.625 inches, 0.625 inches, and the 0.50 inches) are center-to-center distances, e.g., measured between centers of the holes.

The second rail segments 204 include segment 220, segment 222, segment 224, and segment 226. In this example, the segment 220 and the segment 222 include rectangular holes 228. By way of contrast, the segment 224 and the segment 226 have circular holes 230. In connection with the example rack standard, horizontal spacing is defined as a distance between corresponding holes of a mounting pair of rails of a rack, e.g., of the rack 102's front rails 110 or back rails 110. In particular, the example rack standard defines that corresponding holes (e.g., hole 232 and hole 234) of a mounting pair of rails are spaced at approximately 18.312 inches (465 millimeters). Like the vertical spacing, this distance between the corresponding holes (e.g., hole 232 and hole 234) is a center-to-center distance, e.g., measured between centers of the corresponding holes.

The third rail segments 206 include segment 236, segment 238, segment 240, and segment 242. In connection with the example rack standard, a rack opening width is defined as a minimum distance between inner edges of a mounting pair of rails of a rack, e.g., between inner edges of the rack 102's front rails 110 or back rails 110. In particular, the example rack standard defines that inner edges (e.g., inner edge 244 and inner edge 246) of a mounting pair of rails have a minimum space between them of approximately 17.72 inches (450 mm). The example rack standard may also specify a front panel width of rack mounted equipment. For instance, the example rack standard may specify that a front panel of equipment, configured for mounting to a standard rack, have a width of 19-inches.

Additionally or alternatively, the example rack standard may specify tolerances for any one or more of the standard's specifications, e.g., the tolerances for vertical hole spacing, horizontal hole spacing, rack opening width, and/or front panel width. In accordance with the described techniques, the rack 102 may be configured as a two-post relay rack having two rails (not shown), or a four-post cabinet rack having four rails (as depicted throughout), or a rack having a different configuration and/or different numbers of rails, without departing from the spirit or scope of the described techniques. Regardless of a number of posts, and corresponding rails, the rack 102 is nevertheless configured according to a rack standard. Although a standard 19-inch rack configured according to EIA-310 is discussed throughout, the rack 102 may be configured according to different standards in accordance with the described techniques, examples of those different standards include 10-inch rack, 11-foot frame, European Telecommunications Standards Institute (ETSI) rack (e.g., ETS 300 119), 23-inch rack, or Open Rack, to name just a few.

Having considered an example environment and rack standard, consider now a discussion of some example systems and details of a rack mountable bracket in accordance with one or more implementations.

Rack Mountable Bracket

Figure 3:
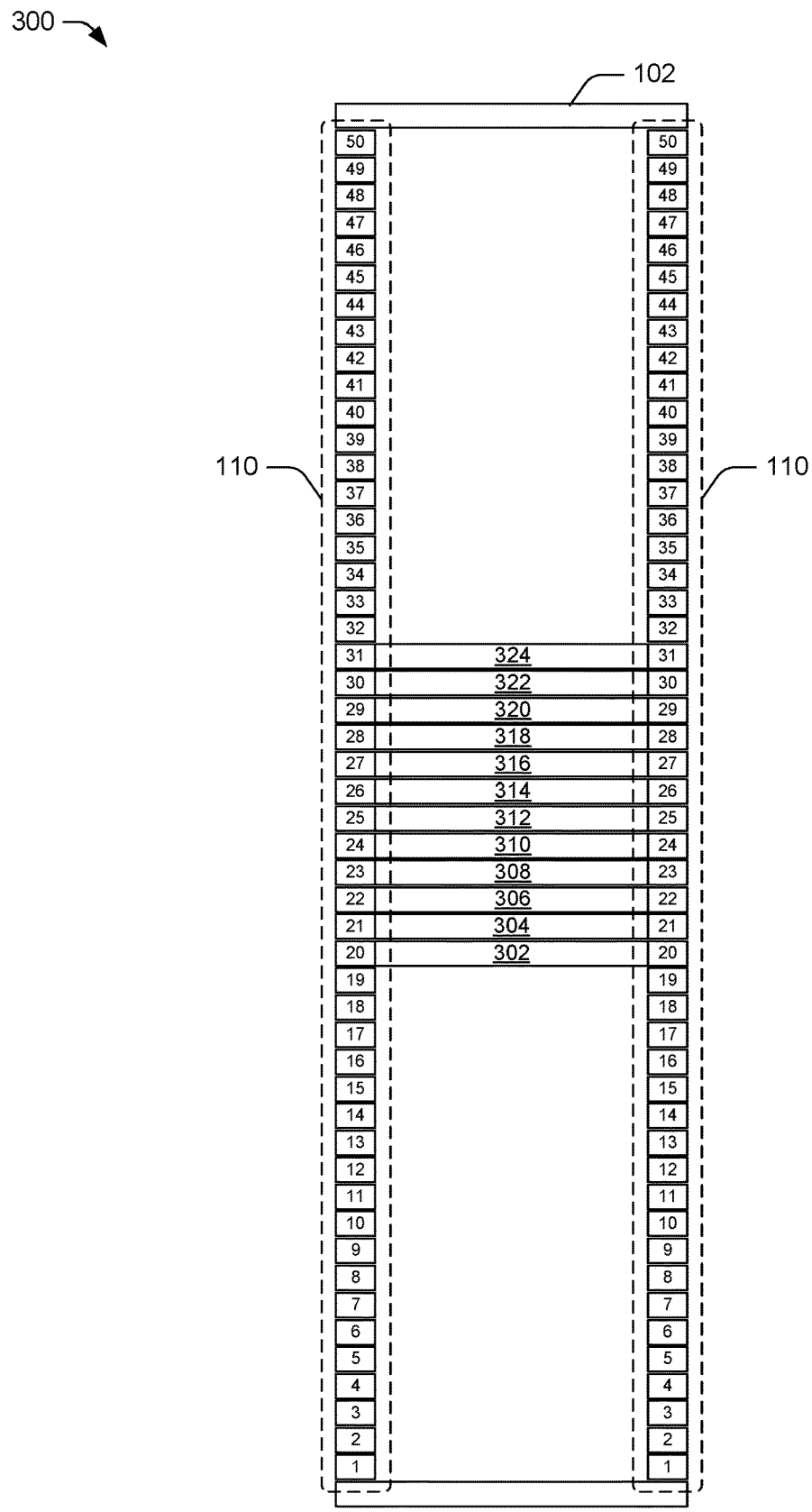
FIG. 3 depicts an example of a rack configured according to the rack standard having computing equipment mounted directly to the rack.

FIG. 3 depicts an example 300 of a rack configured according to the rack standard having computing equipment mounted directly to the rack.

This example 300 includes from FIG. 1, the rack 102, which is configured according to the rack standard. The example 300 also includes rack mounted equipment 302-324. Notably, the example includes twelve items of the rack mounted equipment 302-324, each of which is mounted to 1U of the rack 102's holes, which are spaced according to the rack standard as discussed above and below. Here, the rack mounted equipment 302-324 is mounted directly to a mounting pair of the rails 110.

Due to this horizontal mounting, directly to the mounting pair of the rails 110, the twelve items of rack mounted equipment 302-324 are mounted to 12U of the rack 102 (e.g., units 20-31)—the twelve items of rack mounted equipment 302-324 consume 12U of vertical space. This contrasts with rack mounted equipment mounted to the rack mountable bracket discussed herein. In the context of the rack mountable bracket, consider the following example.

Figure 4:
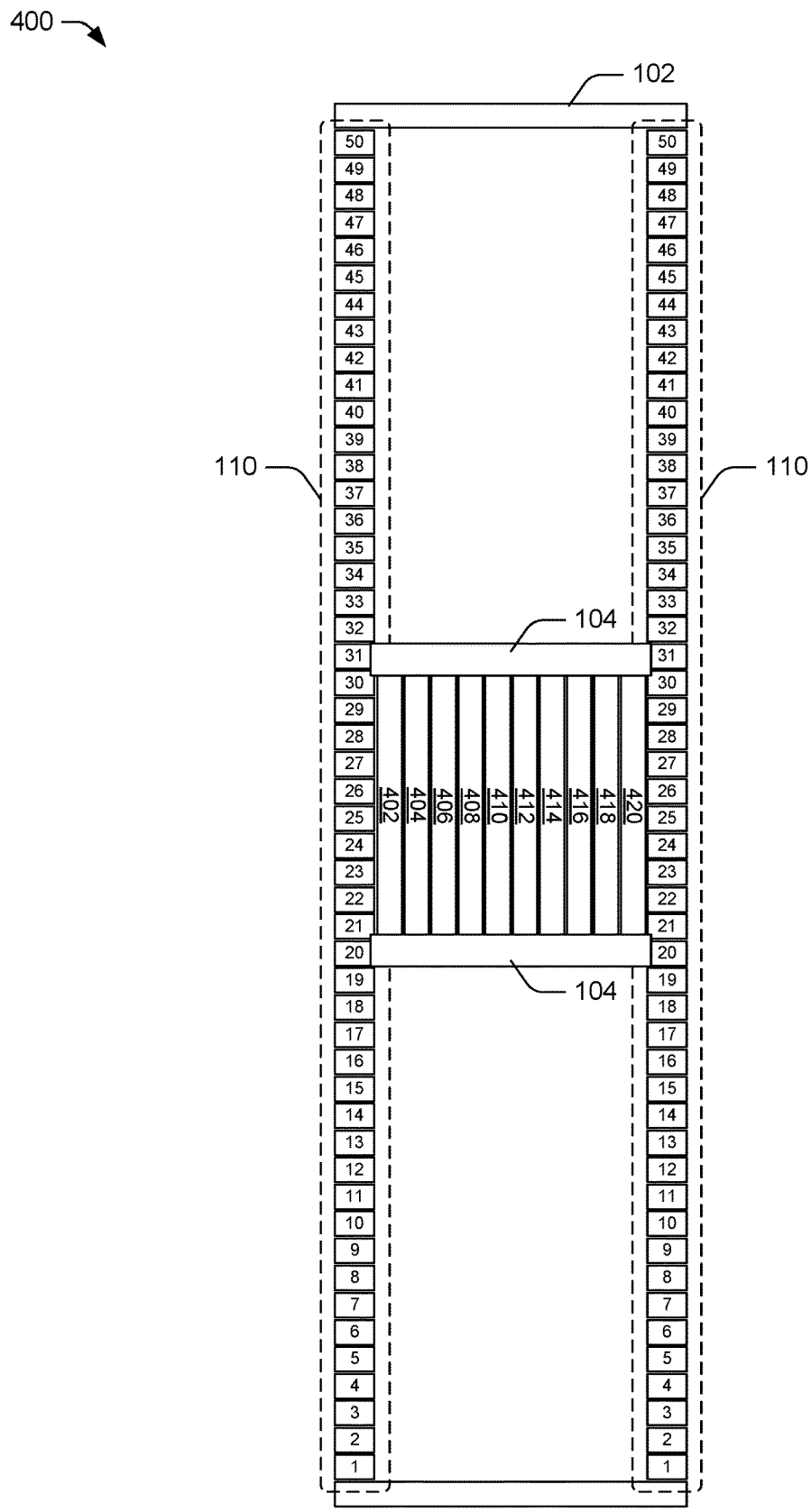
FIG. 4 depicts an example of a rack configured according to the rack standard having a rack mountable bracket mounted directly to the rack and computing equipment mounted directly to the bracket.

FIG. 4 depicts an example 400 of a system that includes a rack configured according to the rack standard and a rack mountable bracket mounted directly to the rack, where computing equipment is mounted directly to the bracket.

This example 400 includes from FIG. 1 the rack 102, which is configured according to the rack standard. The example 400 also includes two brackets 104 and rack mounted equipment 402-420. Notably, the example 400 includes ten items of the rack mounted equipment 402-420, rather than twelve items as depicted in FIG. 3. Here, each item of the rack mounted equipment 402-420, is mounted simultaneously to 1U of holes of each of the equipment mounting rails 116, e.g., 1U of holes of each hole strip 118. As noted above and below, the holes of the equipment mounting rail 116 are spaced according to the rack standard as discussed above and below.

In this example 400, the two brackets 104 are mounted directly to a mounting pair of the rails 110 rather than the rack mounted equipment 402-420. Due to this vertical mounting of the rack mounted equipment 402-420 to the two brackets 104 and due to the brackets 104 being mounted directly to the mounting pair of the rails 110, the ten items of rack mounted equipment 402-420 consume 12U of vertical space (e.g., units 20-31). By using the two brackets 104, two fewer units worth of equipment can be mounted as compared to mounting the equipment directly to the rails 110 of the rack.

Figure 5:
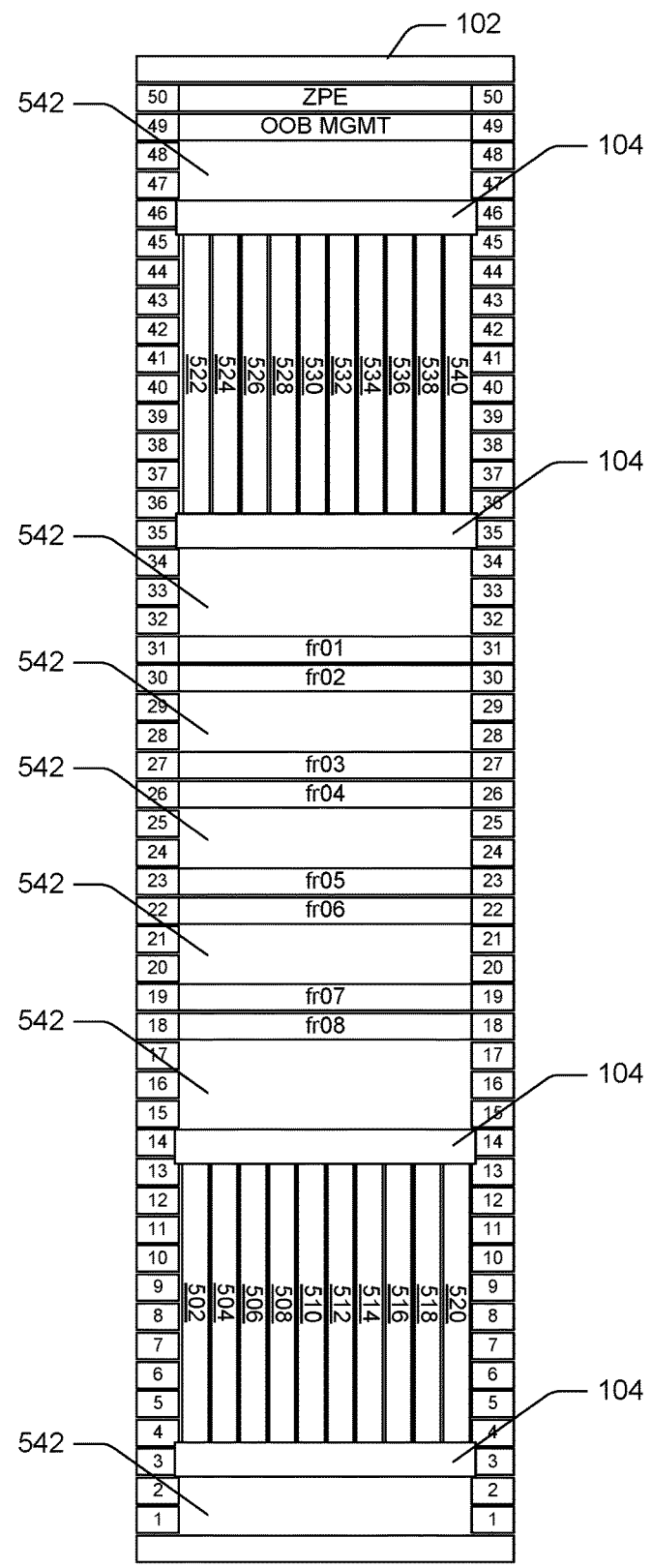
FIG. 5 depicts an example of a rack configured according to the rack standard having rack mountable brackets mounted directly to the rack and computing equipment mounted directly to the bracket.

FIG. 5 depicts an example 500 of a system that includes a rack configured according to the rack standard and rack mountable brackets mounted directly to the rack, where computing equipment is mounted directly to the brackets.

The illustrated example 500 depicts one implementation in which pairs of mountable brackets are deployed and includes from FIG. 1 the rack 102 along with multiple brackets 104. Here, equipment 502-520 is mounted directly to a first pair of the brackets 104, which are mounted directly to a mounting pair of the rails 110 of the rack 102. The illustrated example 500 also includes equipment 522-540, which is mounted directly to a second pair of the brackets 104. Like the first pair, the second pair of the brackets 104 is mounted directly to the mounting pair of the rails 110. The illustrated example 500 also depicts multi-unit spaces 542. These multi-unit spaces 542 may be used, for example, as passthroughs for cables and/or to mount shelves for storing equipment and/or various other items. The illustrated example 500 is also depicted with additional computing equipment and/or organization equipment (e.g., shelving) mounted horizontally and directly to the mounting pair of the rails. In the context of various configurations of the bracket 104, consider the following examples.

Figure 6:
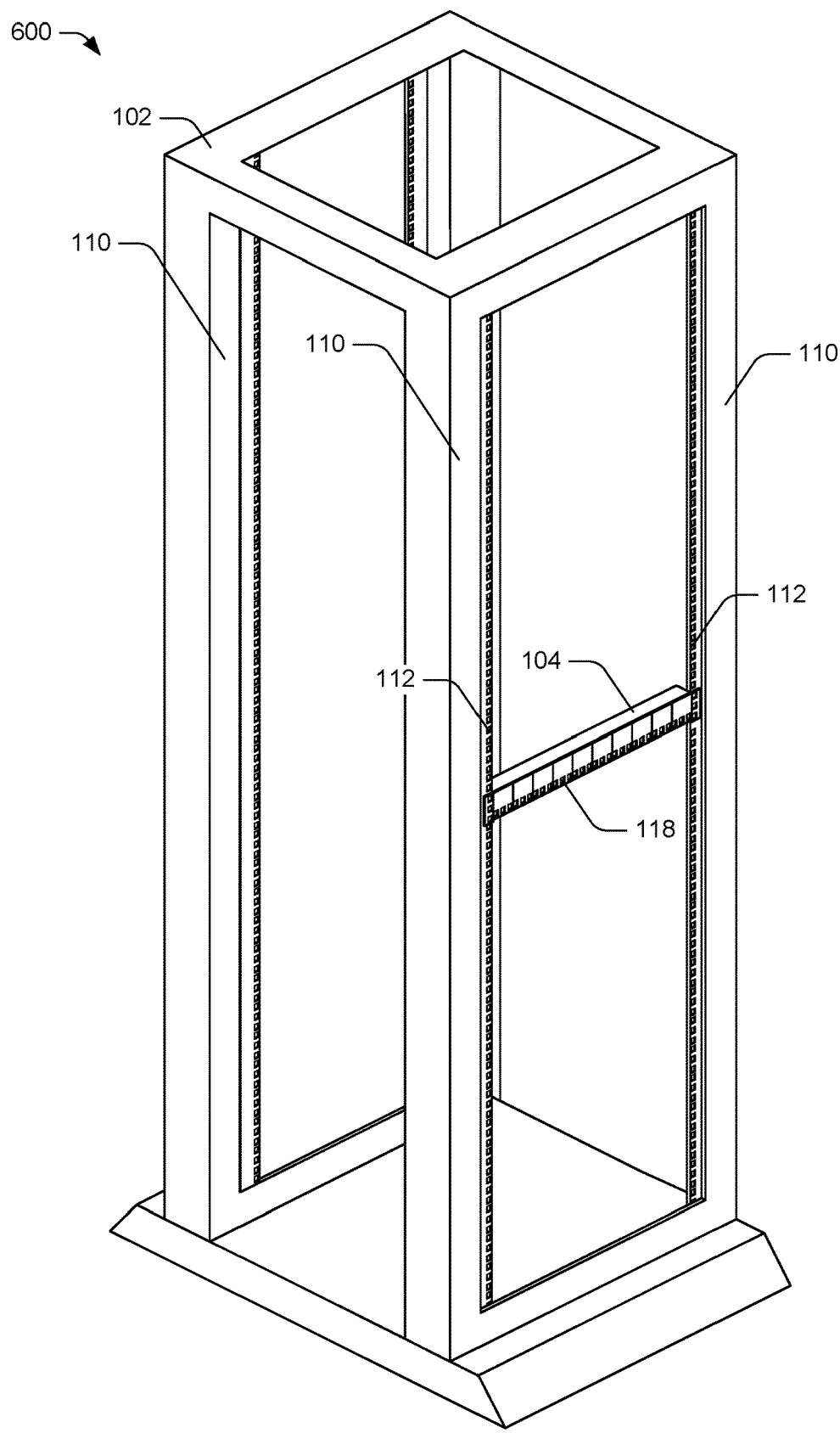
FIG. 6 depicts a first example implementation of a bracket mounted to a rack configured according to a rack standard.

FIG. 6 depicts a first example 600 of an implementation of a bracket mounted to a rack configured according to a rack standard. The illustrated example 600 includes from FIG. 1 the rack 102 and the bracket 104 mounted to the rack 102 using the hole strips 112 of a mounting pair of the rack 102's rails 110. In this example 600, one bracket 104 is depicted. It is to be appreciated that in operation, however, a second bracket 104 may also be mounted to the rack 102, such that the two brackets 104 can be used to mount rack mounted equipment simultaneously to a top of the two brackets and a bottom of the two brackets, e.g., using the hole strips 118 of those respective brackets.

Figure 7:
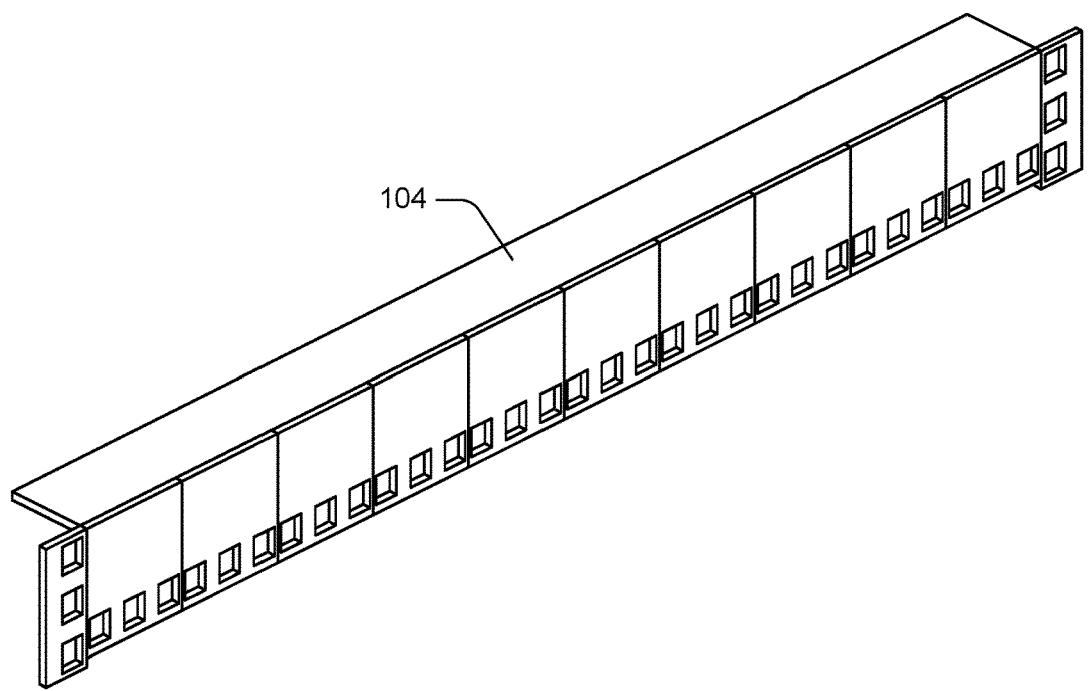
FIG. 7 depicts a perspective view of the first example implementation of the bracket.

FIG. 7 depicts a perspective view 700 of the first example implementation of the bracket. The illustrated view 700 includes from FIG. 1 the bracket 104.

Figure 8:
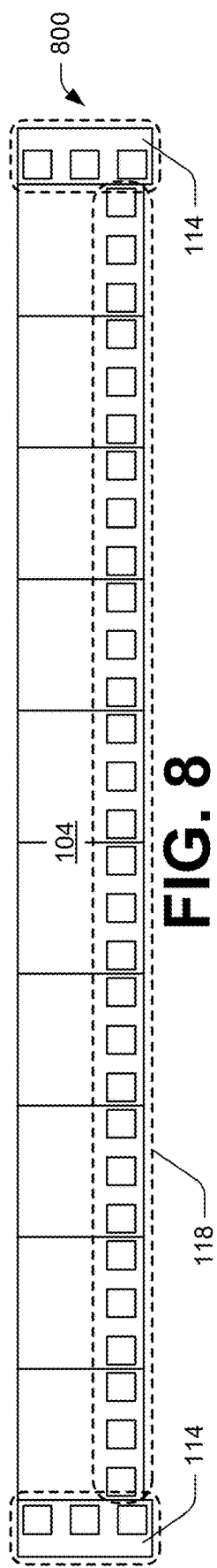
FIG. 8 depicts a front view of the first example implementation of the bracket.

FIG. 8 depicts a front view 800 of the first example implementation of the bracket. The illustrated view 800 includes from FIG. 1 the bracket 104.

Figure 9:
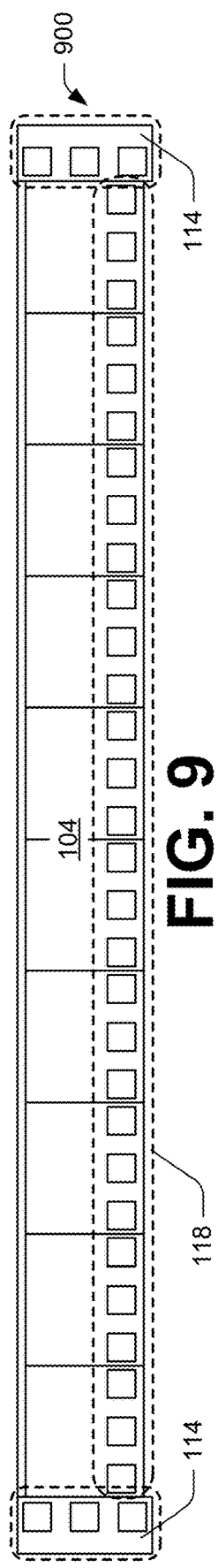
FIG. 9 depicts a rear view of the first example implementation of the bracket.

FIG. 9 depicts a rear view 900 of the first example implementation of the bracket. The illustrated view 900 includes from FIG. 1 the bracket 104.

Figure 10:
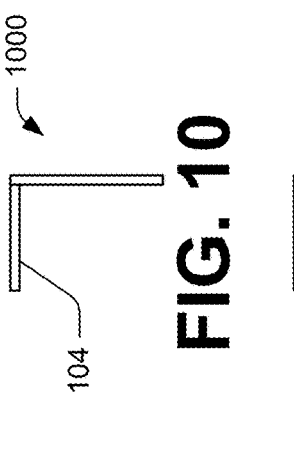
FIG. 10 depicts a left side view of the first example implementation of the bracket.

FIG. 10 depicts a left side view 1000 of the first example implementation of the bracket. The illustrated view 1000 includes from FIG. 1 the bracket 104.

Figure 11:
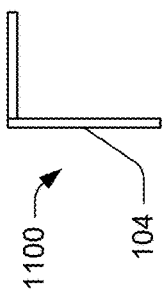
FIG. 11 depicts a right side view of the first example implementation of the bracket.

FIG. 11 depicts a right side view 1100 of the first example implementation of the bracket. The illustrated view 1100 includes from FIG. 1 the bracket 104.

Figure 12:
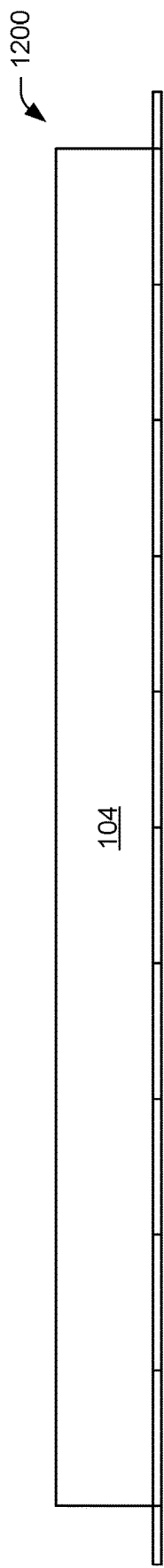
FIG. 12 depicts a top view of the first example implementation of the bracket.

FIG. 12 depicts a top view 1200 of the first example implementation of the bracket. The illustrated view 1200 includes from FIG. 1 the bracket 104.

Figure 13:
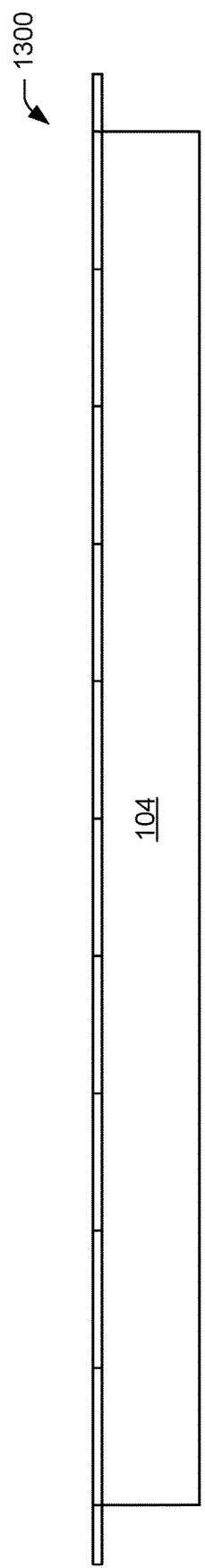
FIG. 13 depicts a bottom view of the first example implementation of the bracket.

FIG. 13 depicts a bottom view 1300 of the first example implementation of the bracket. The illustrated view 1300 includes from FIG. 1 the bracket 104.

Figure 14:
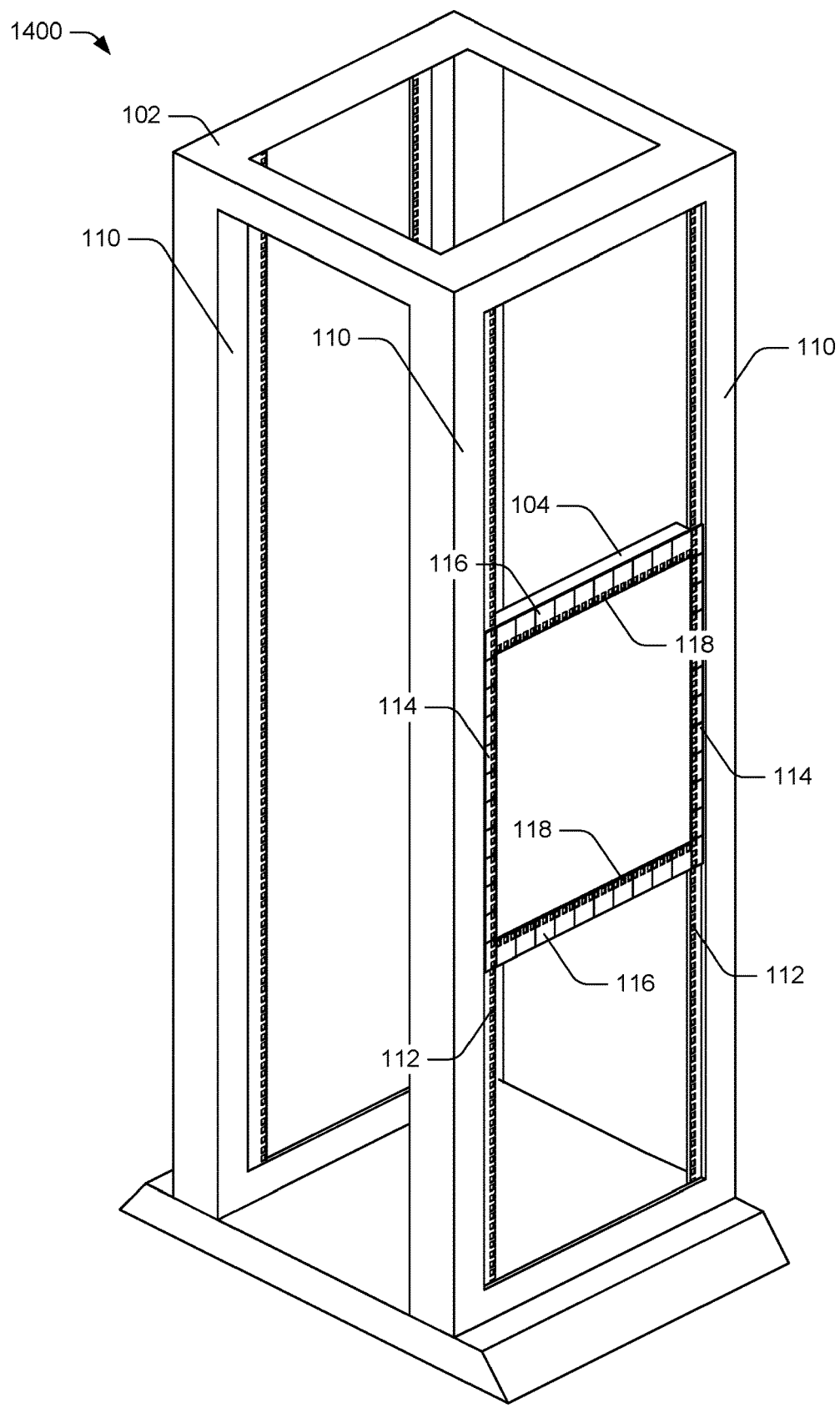
FIG. 14 depicts a second example implementation of a bracket mounted to a rack configured according to a rack standard.

FIG. 14 depicts a second example 1400 of an implementation of a bracket mounted to a rack configured according to a rack standard. The illustrated example 1400 includes from FIG. 1 the rack 102 and the bracket 104 mounted to the rack 102 using the hole strips 112 of a mounting pair of the rack 102's rails 110. Here, the bracket 104 includes two equipment mounting rails 116, both of which are disposed between the pair of mounting edges 114. Additionally, both equipment mounting rails 116 of the bracket 104 include a respective hole strip 118.

Figure 15:
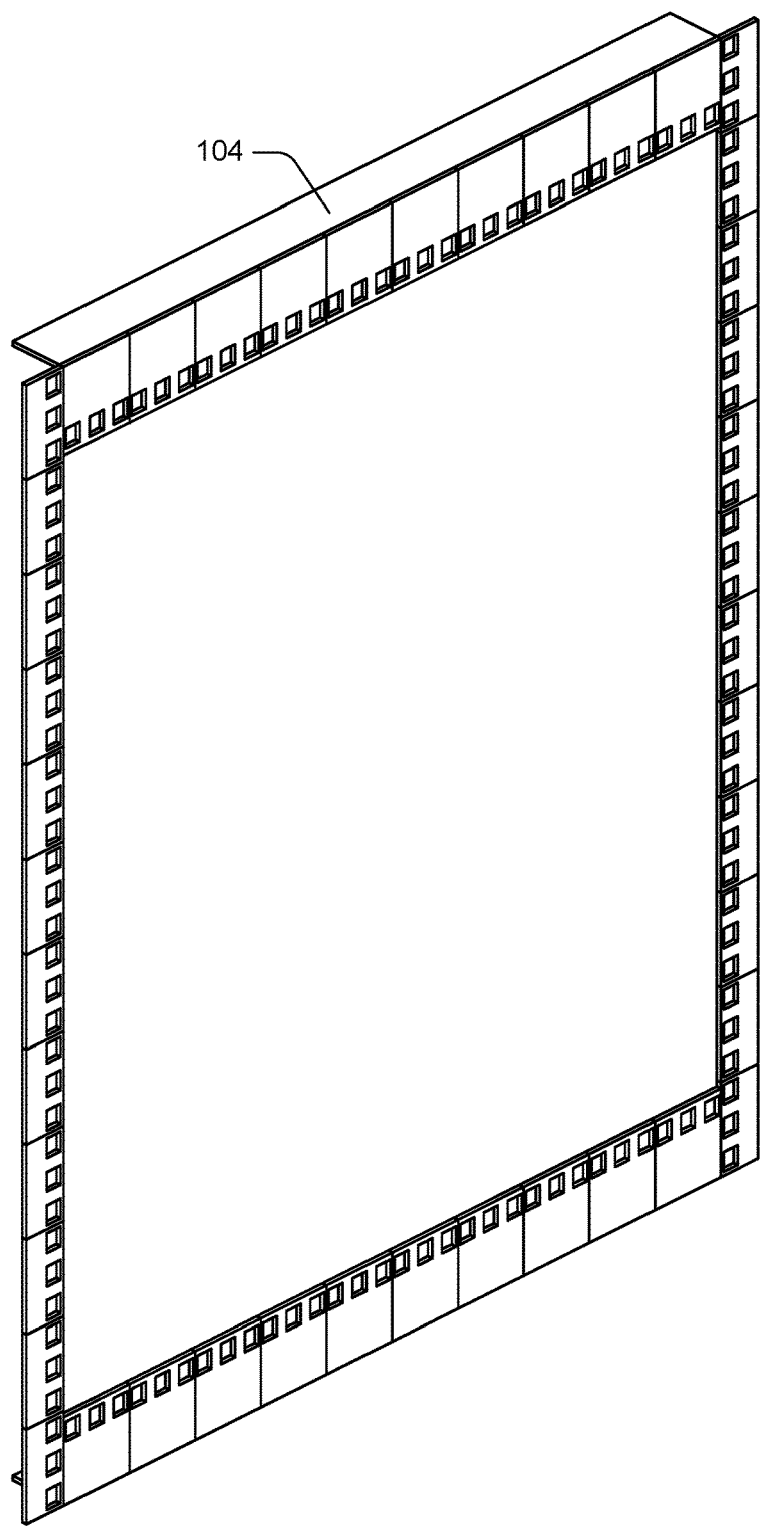
FIG. 15 depicts a perspective view of the second example implementation of the bracket.

FIG. 15 depicts a perspective view 1500 of the second example implementation of the bracket. The illustrated view 1500 includes from FIG. 1 the bracket 104.

Figure 16:
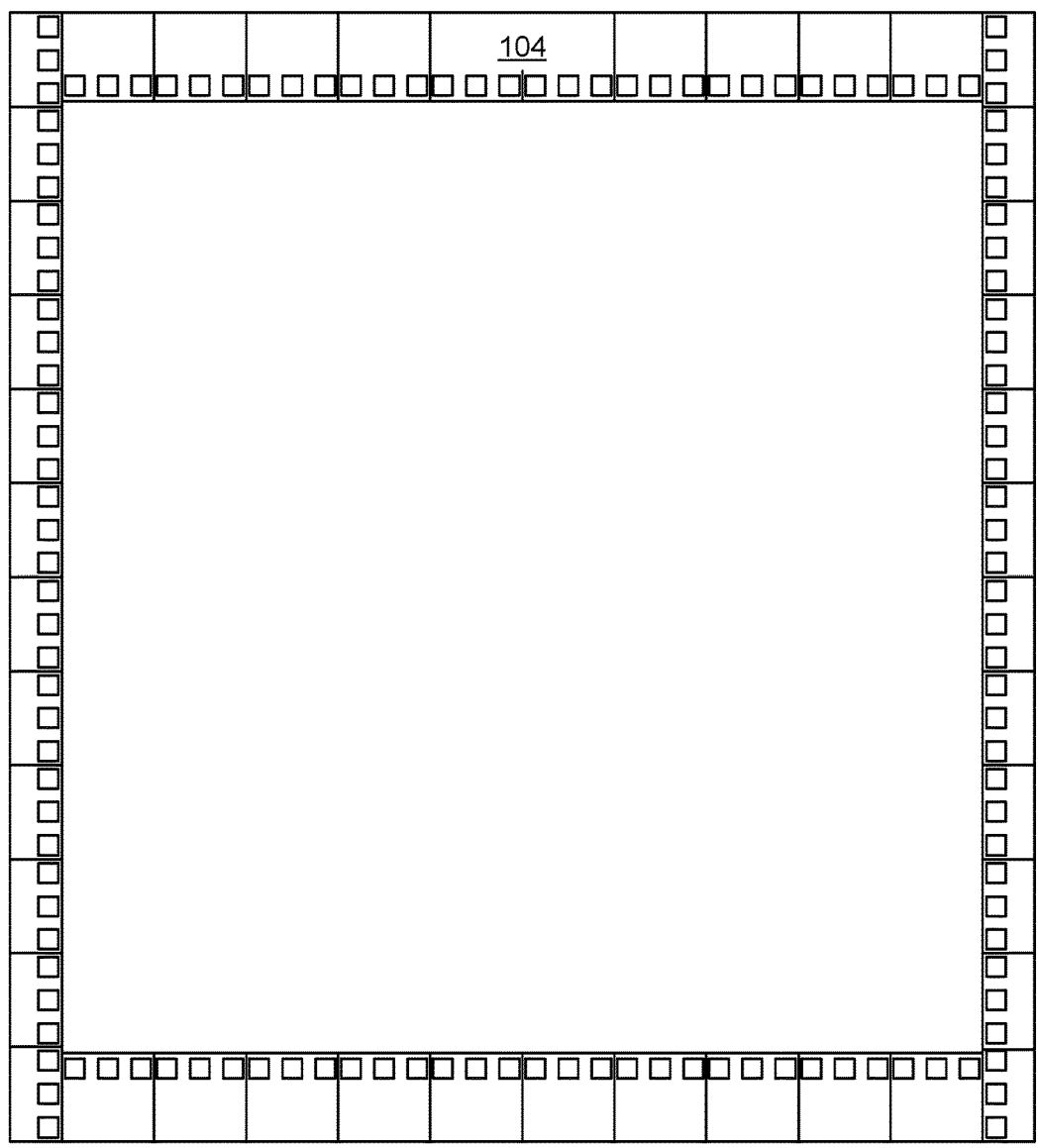
FIG. 16 depicts a front view of the second example implementation of the bracket.

FIG. 16 depicts a front view 1600 of the second example implementation of the bracket. The illustrated view 1600 includes from FIG. 1 the bracket 104.

Figure 17:
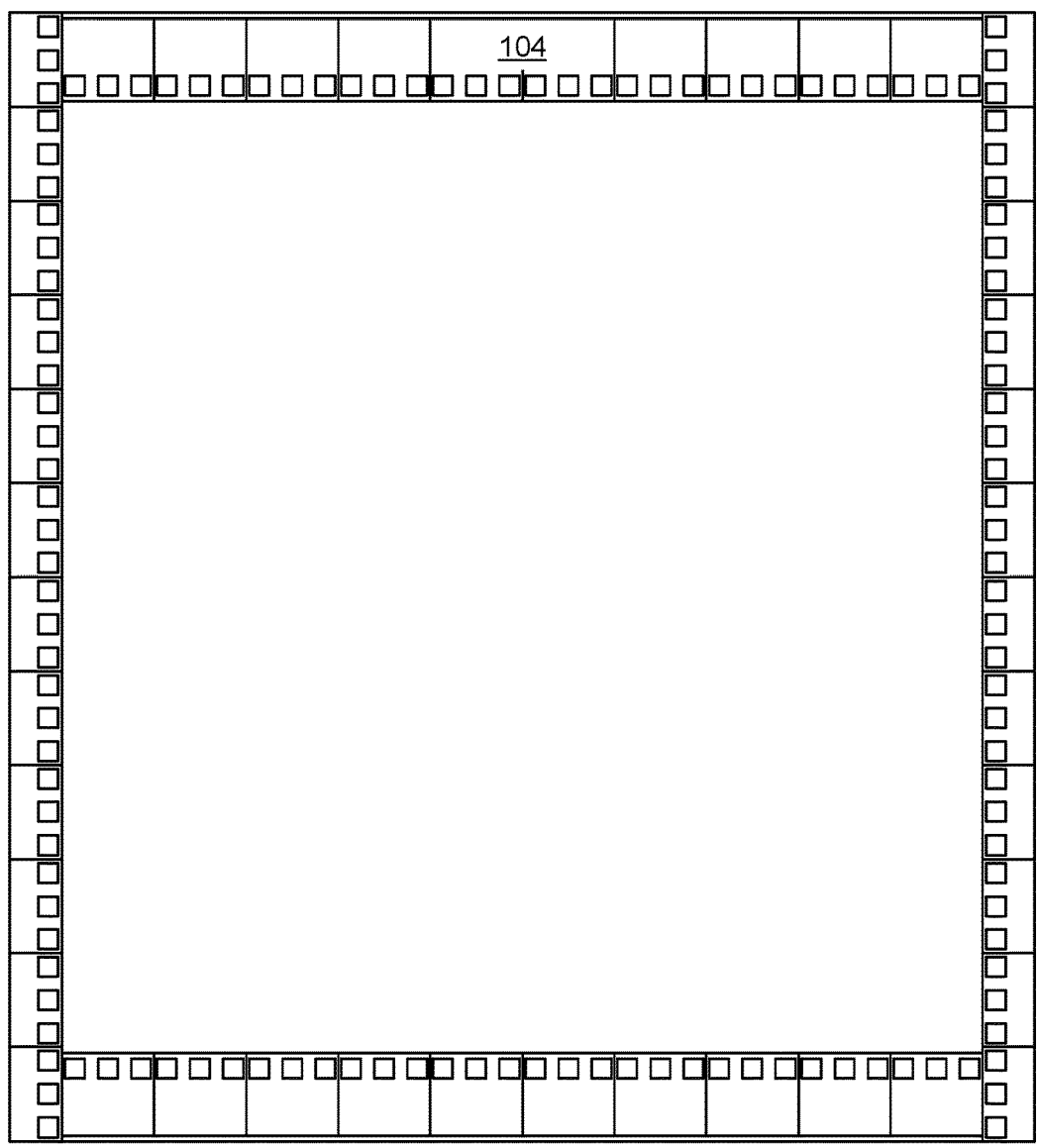
FIG. 17 depicts a rear view of the second example implementation of the bracket.

FIG. 17 depicts a rear view 1700 of the second example implementation of the bracket. The illustrated view 1700 includes from FIG. 1 the bracket 104.

Figure 18:
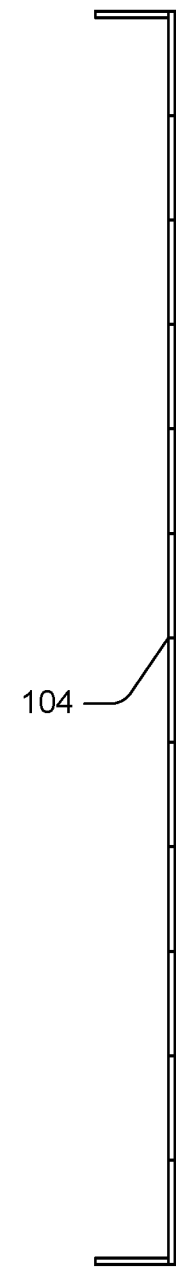
FIG. 18 depicts a left side view of the second example implementation of the bracket.

FIG. 18 depicts a left side view 1800 of the second example implementation of the bracket. The illustrated view 1800 includes from FIG. 1 the bracket 104.

Figure 19:
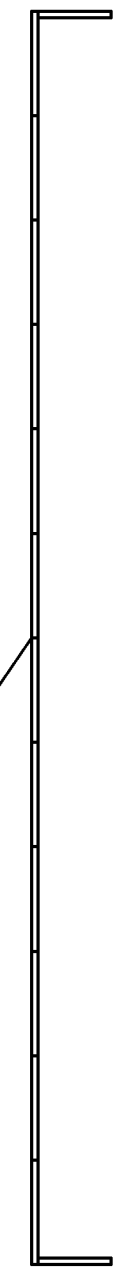
FIG. 19 depicts a right side view of the second example implementation of the bracket.

FIG. 19 depicts a right side view 1900 of the second example implementation of the bracket. The illustrated view 1900 includes from FIG. 1 the bracket 104.

Figure 20:
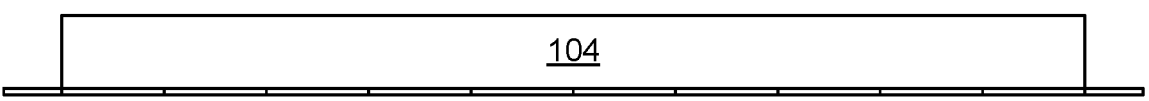
FIG. 20 depicts a top view of the second example implementation of the bracket.

FIG. 20 depicts a top view 2000 of the second example implementation of the bracket. The illustrated view 2000 includes from FIG. 1 the bracket 104.

Figure 21:
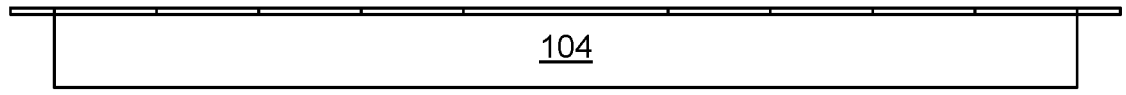
FIG. 21 depicts a bottom view of the second example implementation of the bracket.

FIG. 21 depicts a bottom view 2100 of the second example implementation of the bracket. The illustrated view 2100 includes from FIG. 1 the bracket 104.

FIG. 22 depicts a third example 2200 of an implementation of a bracket mounted to a rack configured according to a rack standard. The illustrated example 2200 includes from FIG. 1 the rack 102 and the bracket 104 mounted to the rack 102 using the hole strips 112 of a mounting pair of the rack 102's rails 110. In this example 2200, the bracket 104 includes a shelf 2202. In one or more implementations, the shelf 2202 is configured to support a load (e.g., weight) of computing equipment mounted to the bracket 104.

Figure 23:
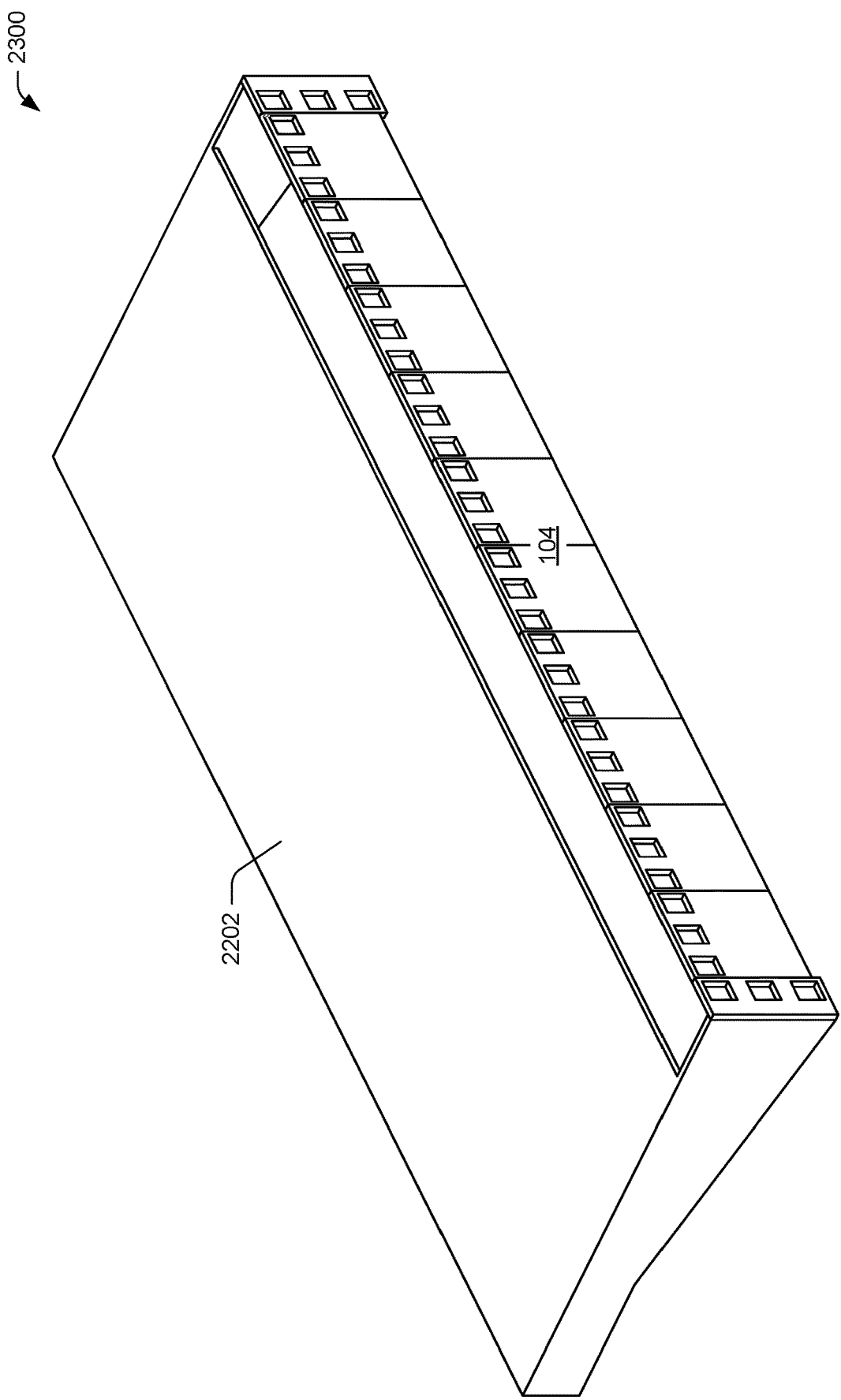
FIG. 23 depicts a perspective view of the third example implementation of the bracket.

FIG. 23 depicts a perspective view 2300 of the third example implementation of the bracket. The illustrated view 2300 includes from FIG. 1 the bracket 104.

Figure 24:
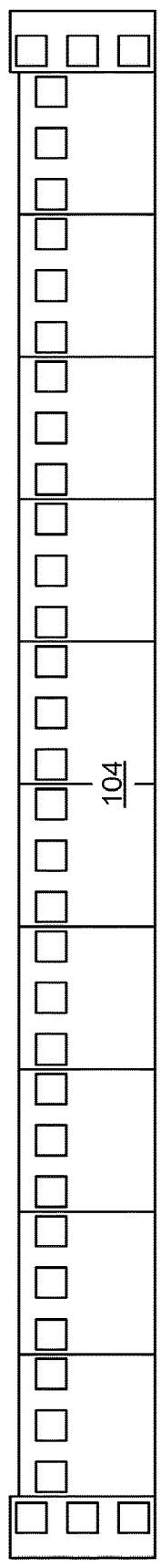
FIG. 24 depicts a front view of the third example implementation of the bracket.

FIG. 24 depicts a front view 2400 of the third example implementation of the bracket. The illustrated view 2400 includes from FIG. 1 the bracket 104.

Figure 25:
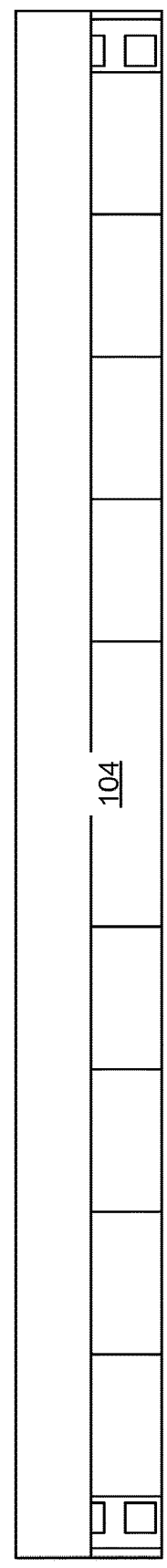
FIG. 25 depicts a rear view of the third example implementation of the bracket.

FIG. 25 depicts a rear view 2500 of the third example implementation of the bracket. The illustrated view 2500 includes from FIG. 1 the bracket 104.

Figure 26:
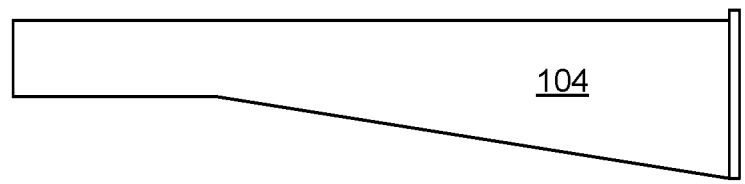
FIG. 26 depicts a left side view of the third example implementation of the bracket.

FIG. 26 depicts a left side view 2600 of the third example implementation of the bracket. The illustrated view 2600 includes from FIG. 1 the bracket 104.

Figure 27:
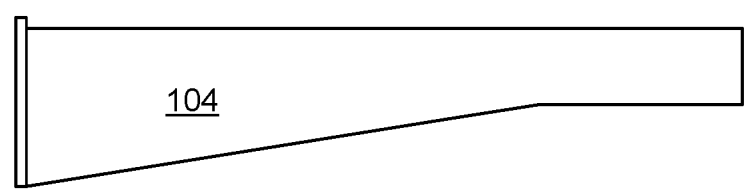
FIG. 27 depicts a right side view of the third example implementation of the bracket.

FIG. 27 depicts a right side view 2700 of the third example implementation of the bracket. The illustrated view 2700 includes from FIG. 1 the bracket 104.

Figure 28:
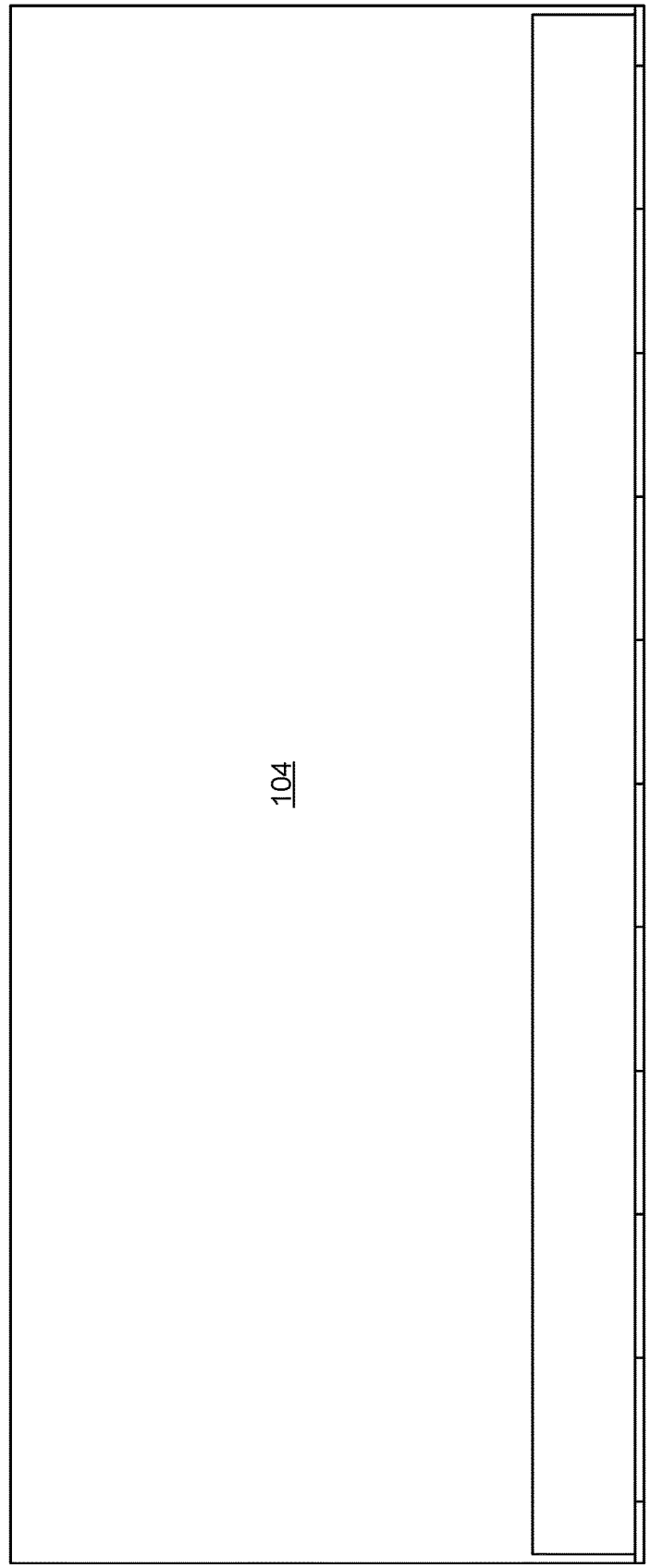
FIG. 28 depicts a top view of the third example implementation of the bracket.

FIG. 28 depicts a top view 2800 of the third example implementation of the bracket. The illustrated view 2800 includes from FIG. 1 the bracket 104.

Figure 29:
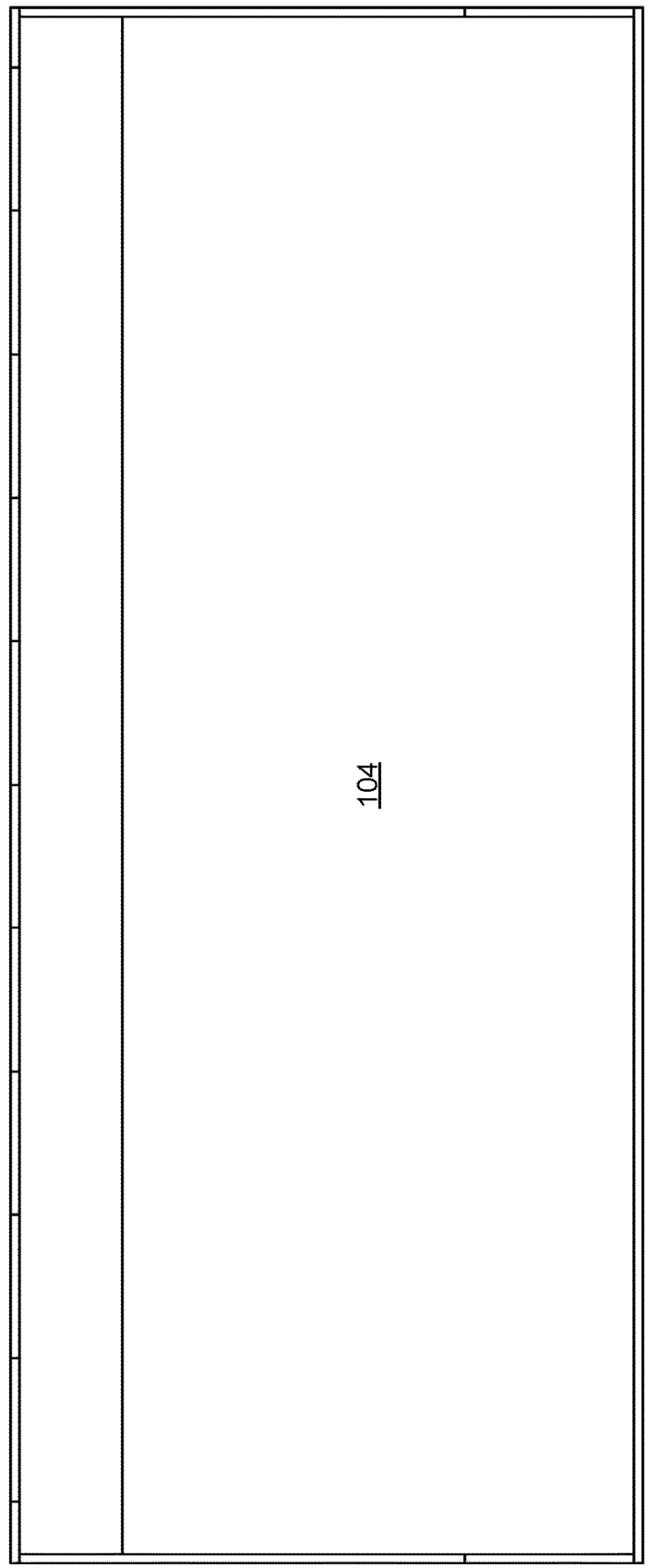
FIG. 29 depicts a bottom view of the third example implementation of the bracket.

FIG. 29 depicts a bottom view 2900 of the third example implementation of the bracket. The illustrated view 2900 includes from FIG. 1 the bracket 104.

FIG. 30 depicts a fourth example 3000 of an implementation of a bracket mounted to a rack configured according to a rack standard. The illustrated example 3000 includes from FIG. 1 the rack 102 and the bracket 104 mounted to the rack 102 using the hole strips 112 of a mounting pair of the rack 102's rails 110. In this example 3000, the bracket 104 includes a shelf 3002. In one or more implementations, the shelf 3002 is configured to support a load (e.g., weight) of computing equipment mounted to the bracket 104. In this example 3000, the bracket 104 is also depicted with a telescoping portion 3004. The telescoping portion 3004 may slide into and out of the bracket 104 such that the telescoping portion 3004 can extend from and retract into the bracket 104. While the bracket 104 with the shelf 3002 is mounted to a front pair of the mounting rails 110, the telescoping portion 3004 can be extended from the bracket and mounted to a back pair of the mounting rails 110, as depicted in the example 3000. Together the shelf 3002 of the bracket 104 and the telescoping portion 3004 may support the load of computing equipment mounted to the bracket 104. In general, the telescoping portion of the bracket 104 may have a complementary shape to the bracket 104 so that the telescoping portion 3004 can be retractably disposed within the bracket 104. The telescoping portion 3004 is further depicted in FIGS. 31-37.

Figure 31:
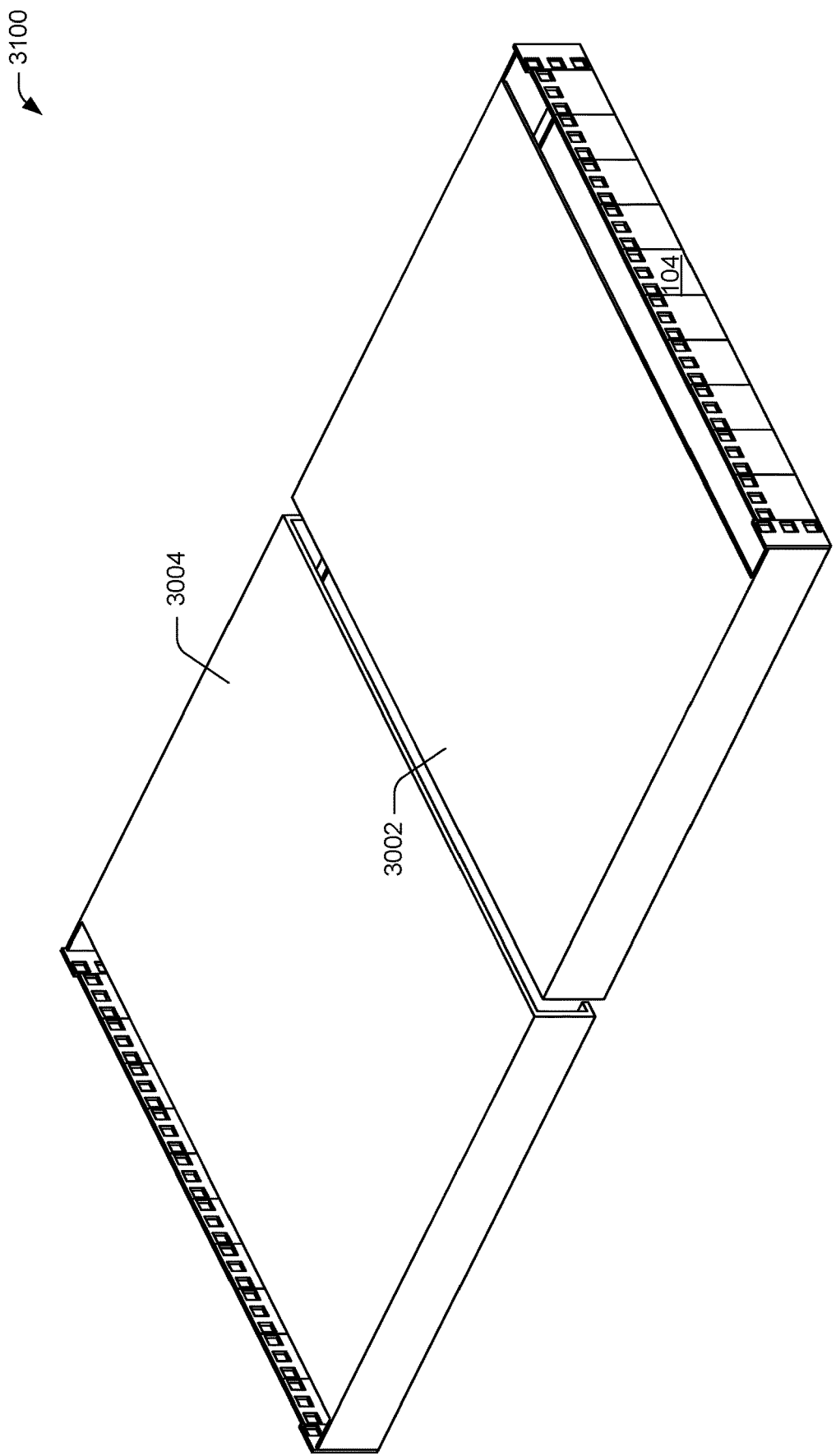
FIG. 31 depicts a perspective view of the fourth example implementation of the bracket.

FIG. 31 depicts a perspective view 3100 of the fourth example implementation of the bracket. The illustrated view 3100 includes from FIG. 1 the bracket 104.

Figure 32:
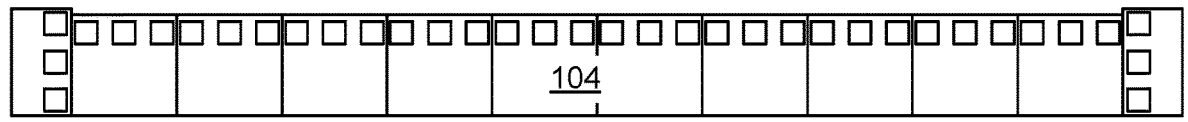
FIG. 32 depicts a front view of the fourth example implementation of the bracket.

FIG. 32 depicts a front view 3200 of the fourth example implementation of the bracket. The illustrated view 3200 includes from FIG. 1 the bracket 104.

Figure 33:
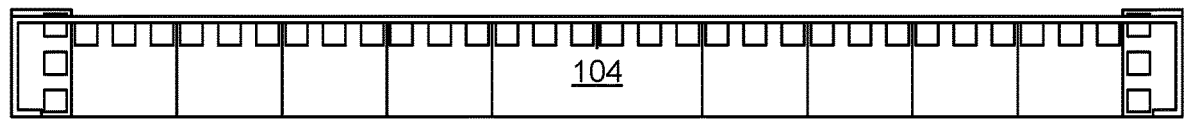
FIG. 33 depicts a rear view of the fourth example implementation of the bracket.

FIG. 33 depicts a rear view 3300 of the fourth example implementation of the bracket. The illustrated view 3300 includes from FIG. 1 the bracket 104.

Figure 34:
FIG. 34 depicts a left side view of the fourth example implementation of the bracket.

FIG. 34 depicts a left side view 3400 of the fourth example implementation of the bracket. The illustrated view 3400 includes from FIG. 1 the bracket 104.

Figure 35:
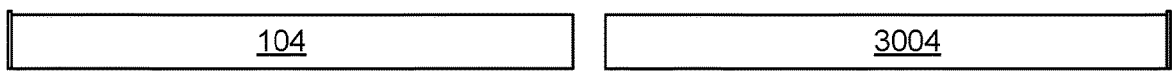
FIG. 35 depicts a right side view of the fourth example implementation of the bracket.

FIG. 35 depicts a right side view 3500 of the fourth example implementation of the bracket. The illustrated view 3500 includes from FIG. 1 the bracket 104.

Figure 36:
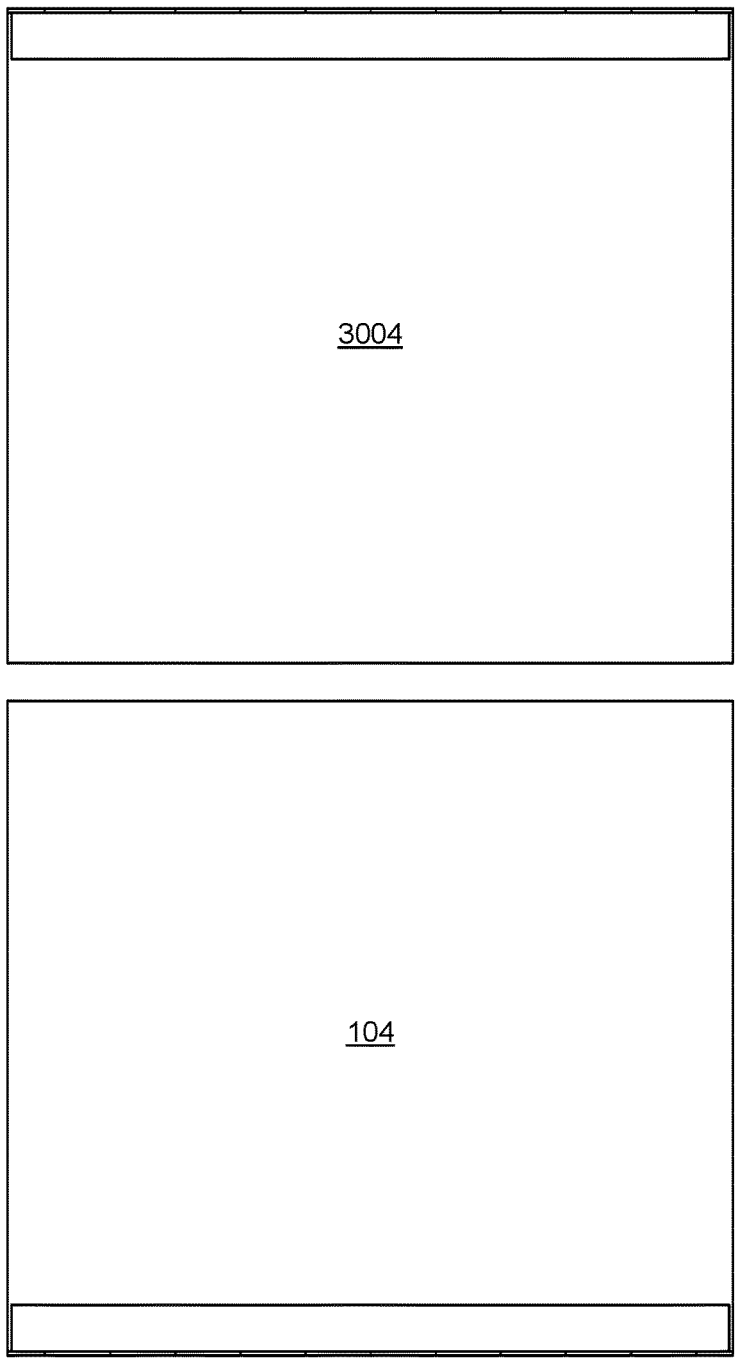
FIG. 36 depicts a top view of the fourth example implementation of the bracket.

FIG. 36 depicts a top view 3600 of the fourth example implementation of the bracket. The illustrated view 3600 includes from FIG. 1 the bracket 104.

Figure 37:
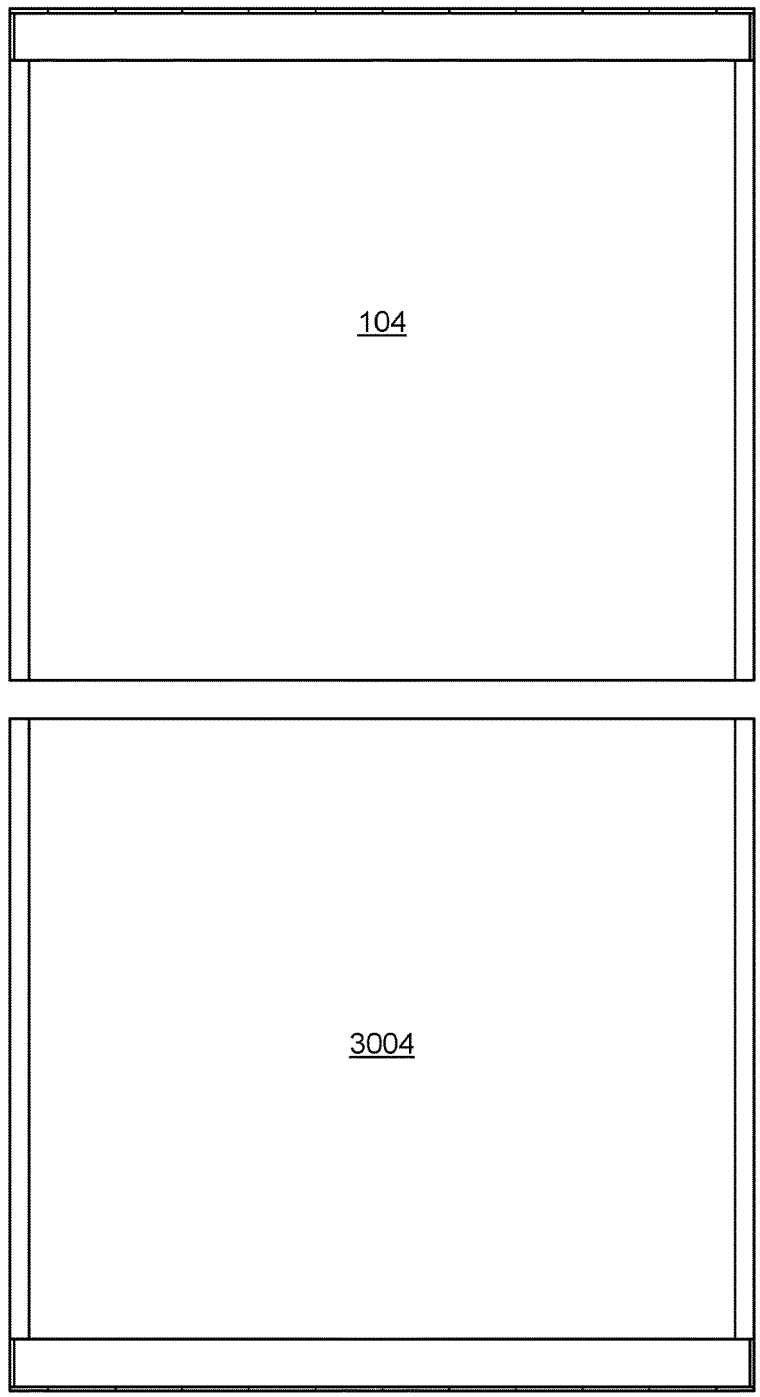
FIG. 37 depicts a bottom view of the fourth example implementation of the bracket.

FIG. 37 depicts a bottom view 3700 of the fourth example implementation of the bracket. The illustrated view 3700 includes from FIG. 1 the bracket 104.

FIG. 38 depicts a fifth example 3800 of an implementation of a bracket mounted to a rack configured according to a rack standard. The illustrated example 3800 includes from FIG. 1 the rack 102 and the bracket 104 mounted to the rack 102 using the hole strips 112 of a mounting pair of the rack 102's rails 110. Here, the bracket 104 includes two equipment mounting rails 116, both of which are disposed between the pair of mounting edges 114. Additionally, both equipment mounting rails 116 include a respective hole strip 118. In this example 3800, the bracket 104 also includes a shelf 3802. In one or more implementations, the shelf 3802 is configured to support a load (e.g., weight) of computing equipment mounted to the bracket 104.

Figure 39:
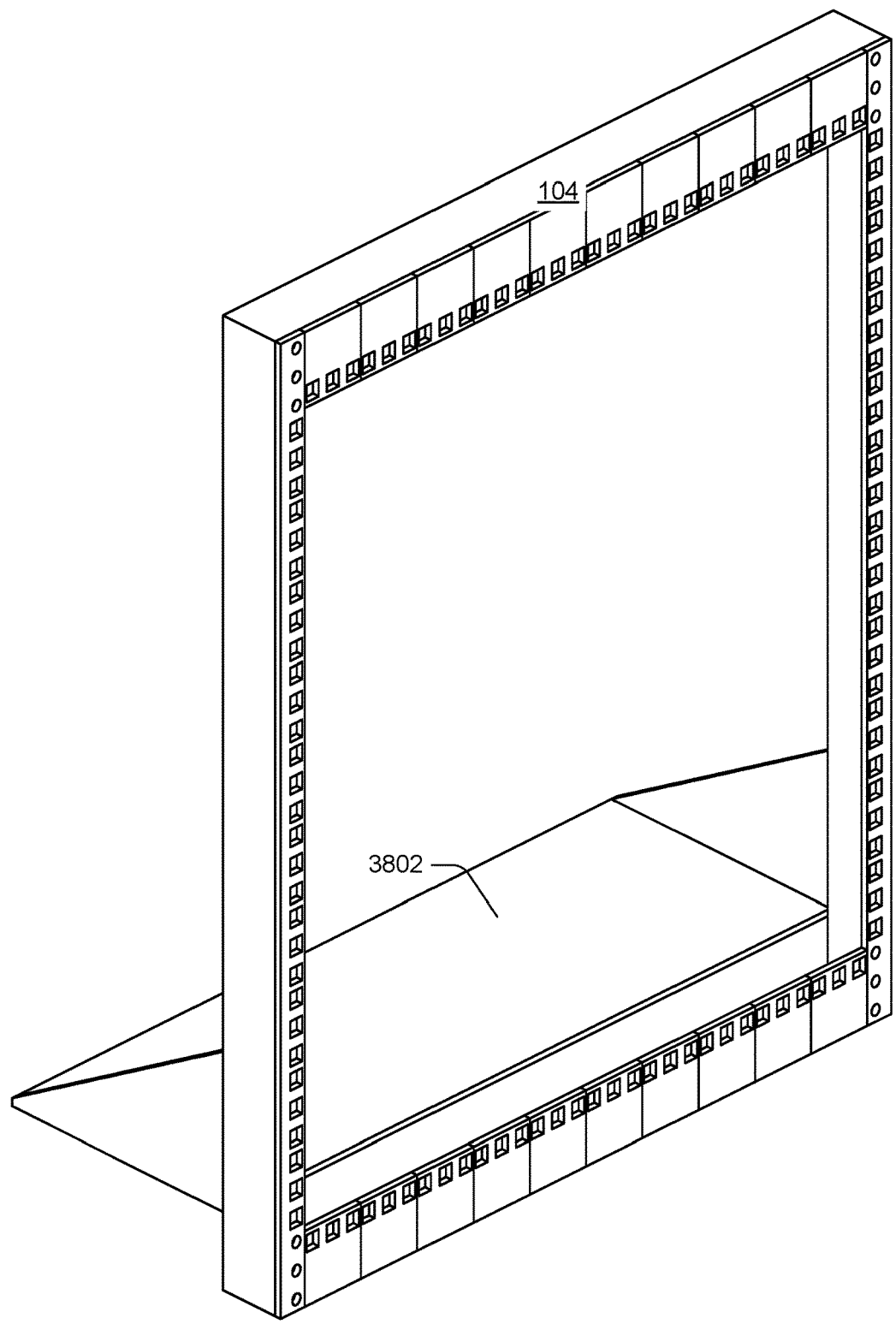
FIG. 39 depicts a perspective view of the fifth example implementation of the bracket.

FIG. 39 depicts a perspective view 3900 of the fifth example implementation of the bracket. The illustrated view 3900 includes from FIG. 1 the bracket 104.

Figure 40:
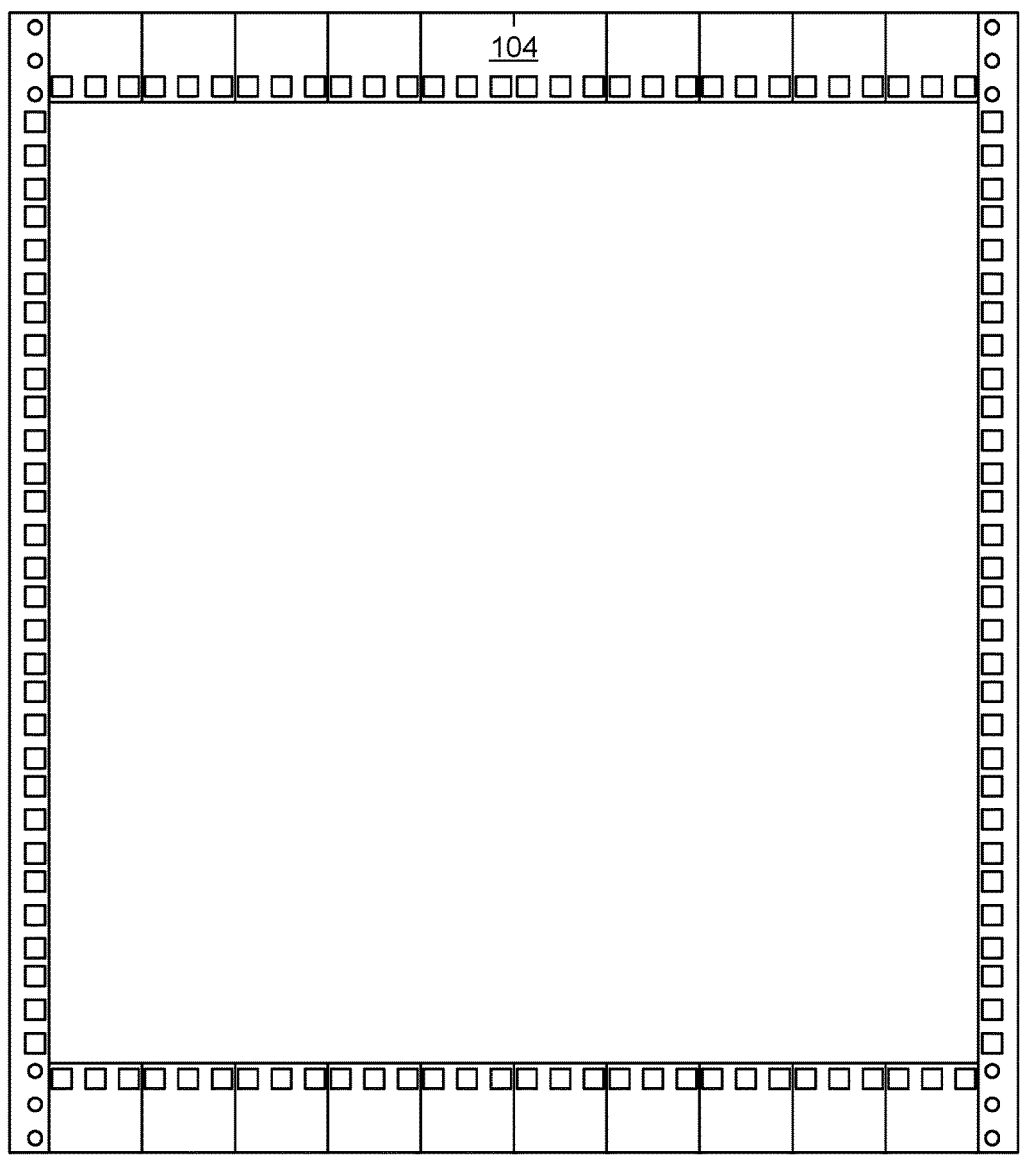
FIG. 40 depicts a front view of the fifth example implementation of the bracket.

FIG. 40 depicts a front view 4000 of the fifth example implementation of the bracket. The illustrated view 4000 includes from FIG. 1 the bracket 104.

Figure 41:
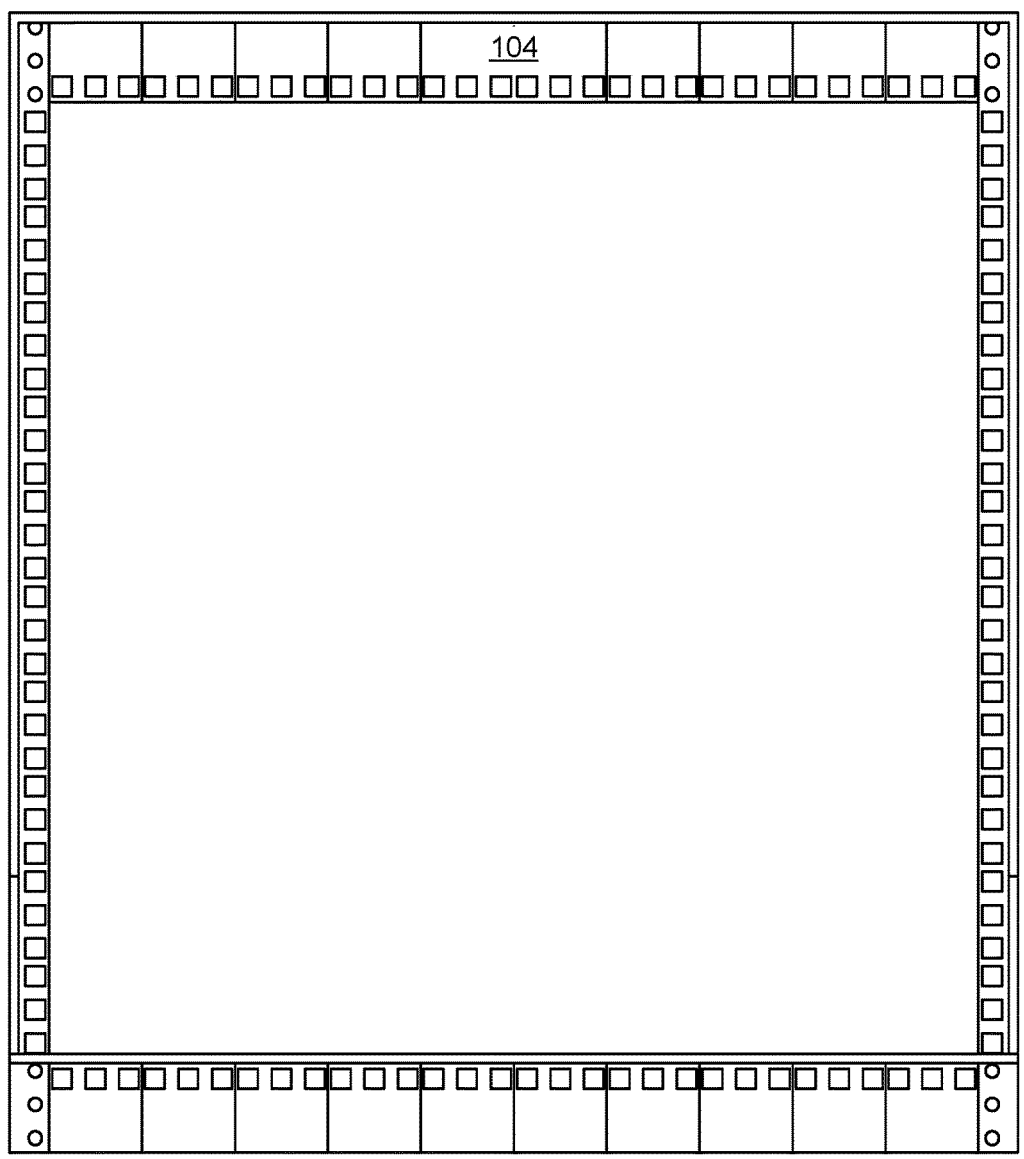
FIG. 41 depicts a rear view of the fifth example implementation of the bracket.

FIG. 41 depicts a rear view 4100 of the fifth example implementation of the bracket. The illustrated view 4100 includes from FIG. 1 the bracket 104.

Figure 42:
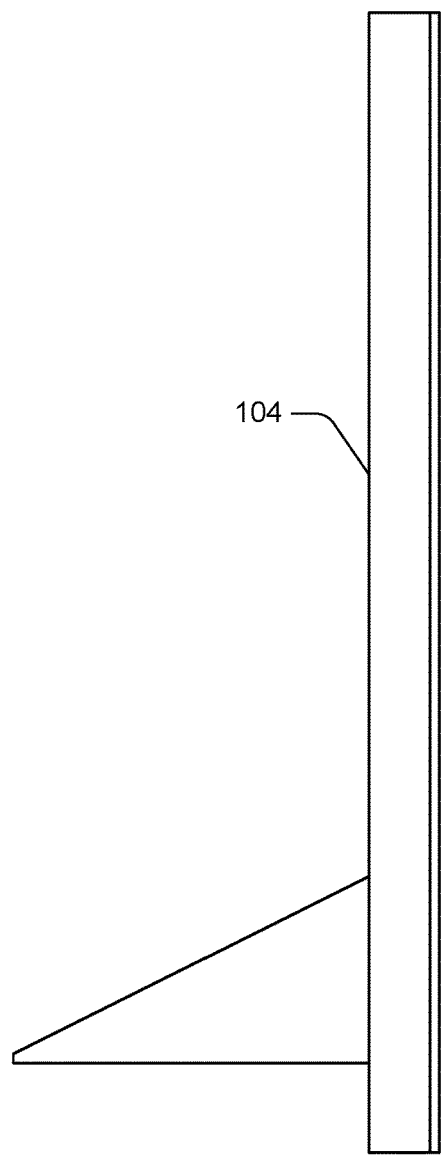
FIG. 42 depicts a left side view of the fifth example implementation of the bracket.

FIG. 42 depicts a left side view 4200 of the fifth example implementation of the bracket. The illustrated view 4200 includes from FIG. 1 the bracket 104.

Figure 43:
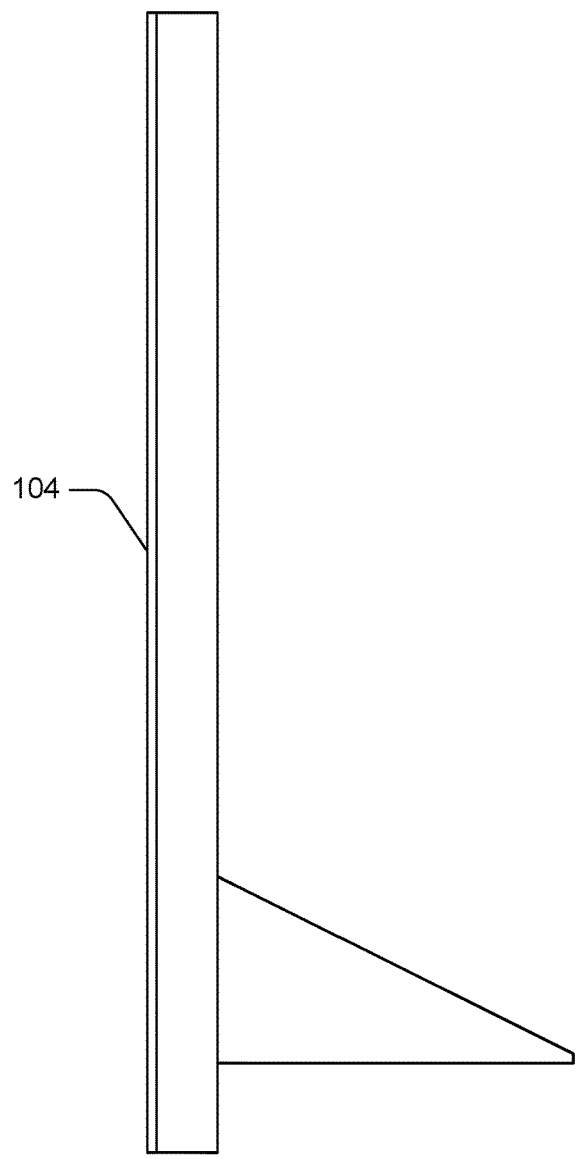
FIG. 43 depicts a right side view of the fifth example implementation of the bracket.

FIG. 43 depicts a right side view 4300 of the fifth example implementation of the bracket. The illustrated view 4300 includes from FIG. 1 the bracket 104.

Figure 44:
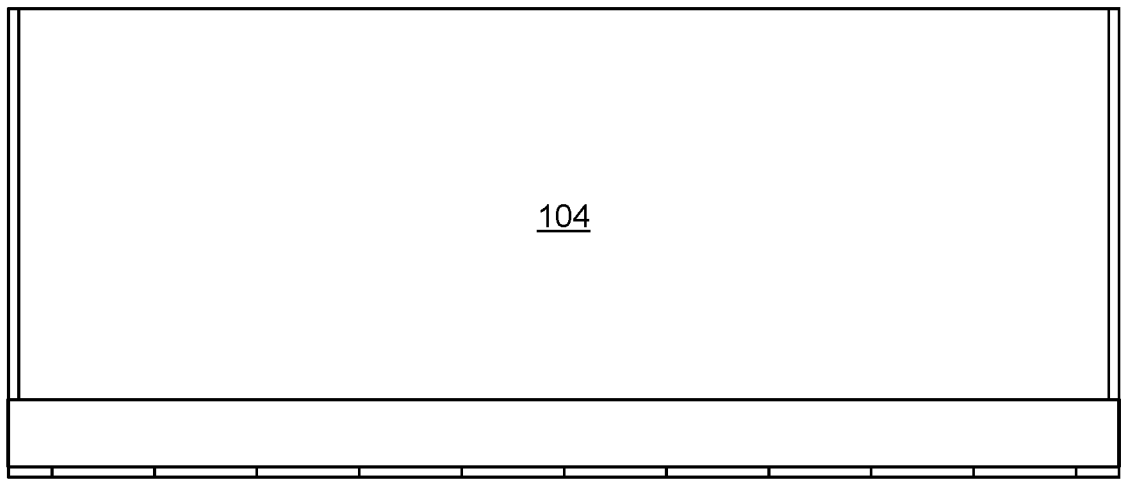
FIG. 44 depicts a top view of the fifth example implementation of the bracket.

FIG. 44 depicts a top view 4400 of the fifth example implementation of the bracket. The illustrated view 4400 includes from FIG. 1 the bracket 104.

Figure 45:
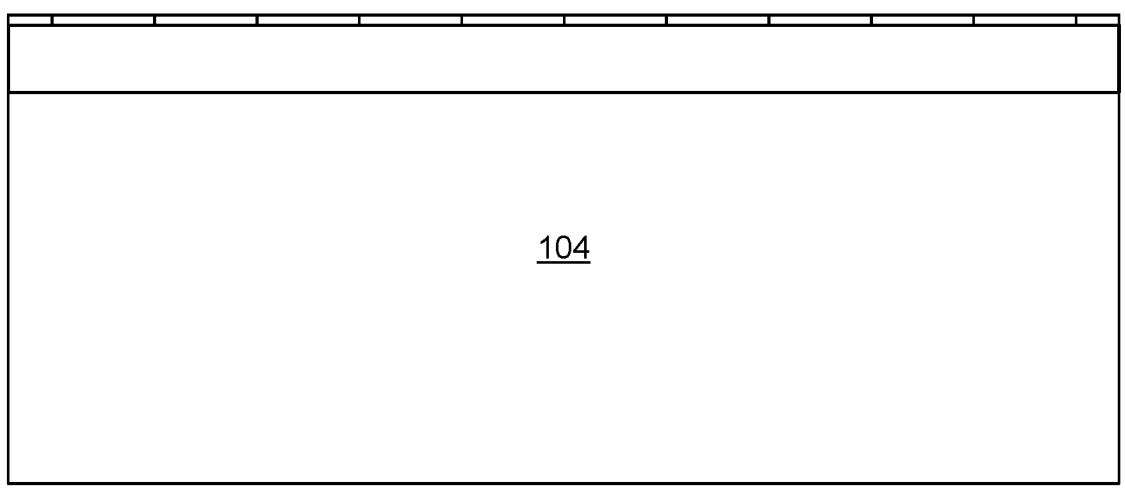
FIG. 45 depicts a bottom view of the fifth example implementation of the bracket.

FIG. 45 depicts a bottom view 4500 of the fifth example implementation of the bracket. The illustrated view 4500 includes from FIG. 1 the bracket 104.

Having discussed example details of the rack mountable bracket, consider now some example procedures to illustrate additional aspects of the rack mountable bracket.

Example Procedures

This section describes example procedures for a rack mountable bracket. The procedures are shown as a set of method blocks that specify operations performed by one or more apparatuses and are not necessarily limited to the orders shown for performing the operations by the respective method blocks. Indeed, the operations may be performed in a different order from the order described below and depicted in FIG. 46.

Figure 46:
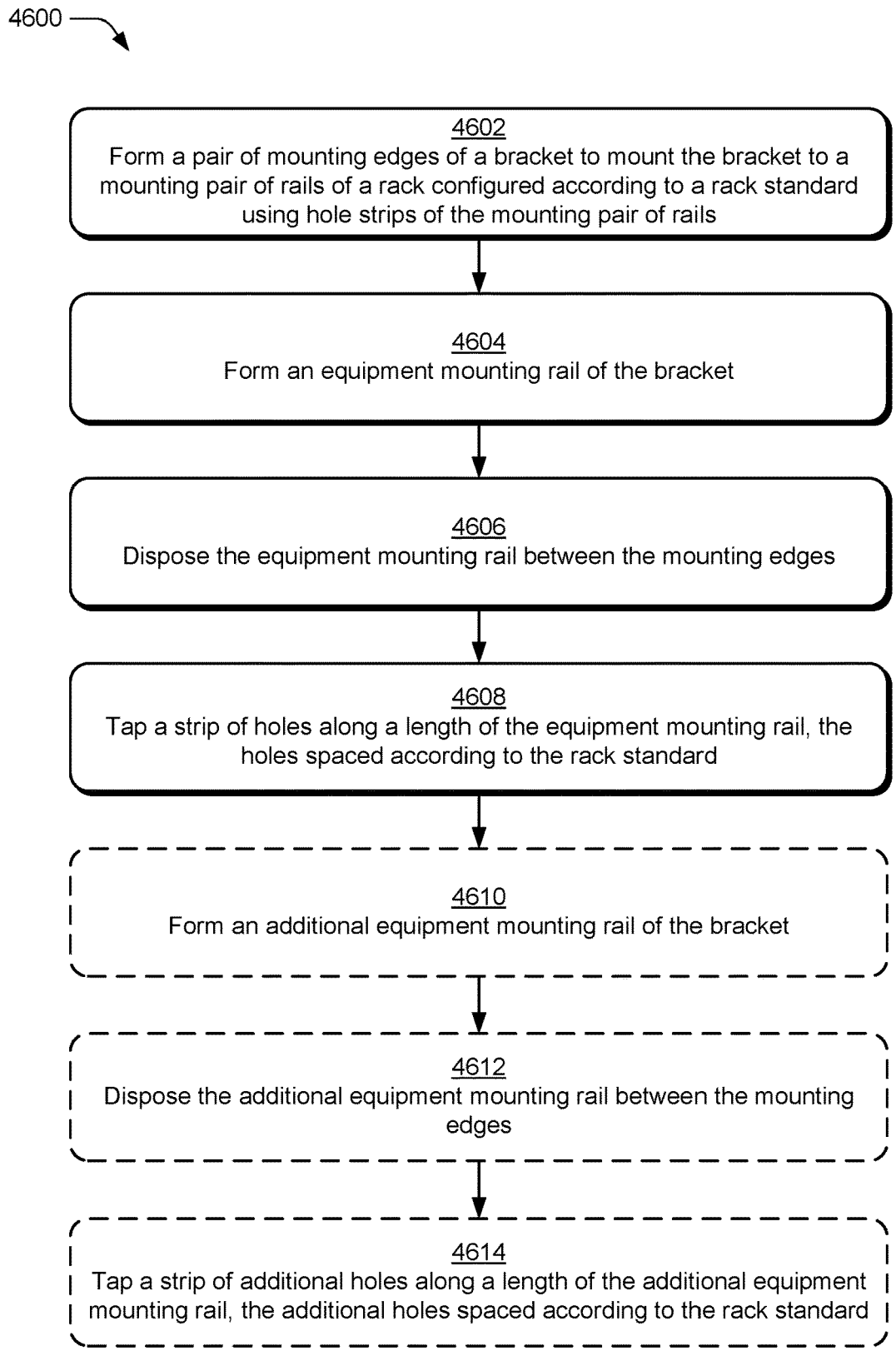
FIG. 46 depicts a procedure in an example implementation in which a rack mountable bracket is formed.

FIG. 46 depicts a procedure 4600 in an example implementation in which a rack mountable bracket is formed. Once formed, the bracket is mountable to a rack configured for mounting equipment and configured according to a rack standard, e.g., EIA-310. As discussed above and below, the rack standard may specify how rails of the rack are disposed, one rail to another, and how a strip of holes disposed along a length of each rail is spaced, one hole relative to another.

A pair of mounting edges of the bracket is formed (block 4602). In accordance with the principles discussed herein, the mounting edges are configured to mount the bracket to a mounting pair of rails of a rack, which are configured according to the rack standard, by using hole strips of the mounting pair of rails. By way of example, the mounting edges 114 of the rack 102 are formed. Forming the mounting edges 114 includes configuring those edges to mount to a standard rack by using hole strips of the mounting pair of rails of the rack. For instance, such configuring may include tapping one or more holes into the mounting edges 114, such that screws can be extended through those holes and the holes of the mounting pair of rails to mount the bracket 104 to the rails. Alternatively or additionally, such configuring may include incorporating with the mounting edges 114 mechanisms (e.g., tabs, inserts, etc.) for mounting the rack 102 to the mounting pair of rails.

An equipment mounting rail of the bracket is formed (block 4604). By way of example, the equipment mounting rail 116 is formed.

The equipment mounting rail is disposed between the mounting edges of the bracket (block 4606). By way of example, the equipment mounting rail 116 is disposed between the mounting edges 114. Based on this, the mounting edges 114 extend from the equipment mounting rail 116.

A strip of holes is tapped along a length of the equipment mounting rail (block 4608). In accordance with the principles discussed herein, the holes are tapped such that the holes are spaced according to the rack standard. By way of example, the hole strip 118 is tapped into the equipment mounting rail 116 such that the holes of the hole strip 118 are spaced according to the rack standard. Additionally, the holes of the hole strip 118 are tapped such that when the bracket 104 is mounted to the mounting pair of rails (e.g., using the mounting edges 114 and the hole strips 112), an axis corresponding to the hole strip 118 is substantially perpendicular to longitudinal axes of the mounting pair of rails. The axis that corresponds to the hole strip 118 may extend through (or substantially across) a length of the hole strip 118.

In one or more implementations, the bracket may be formed to include an additional equipment mounting rail, such as in FIGS. 14-21 and 38-45. Accordingly, the following steps (4610-4614) of the procedure 4600 are optional insofar as they may be used in connection with those implementations, e.g., where the bracket is formed to include an additional equipment mounting rail. These steps are depicted as optional in the illustrated example through use of dashed lines.

An additional equipment mounting rail of the bracket is formed (block 4610). By way of example, an additional equipment mounting rail, which may be substantially similar to or the same as the equipment mounting rail 116, is formed.

The additional equipment mounting rail is disposed between the mounting edges of the bracket (block 4612). By way of example, the additional equipment mounting rail is disposed between the mounting edges 114. Based on this, the mounting edges 114 extend from both the equipment mounting rail 116 and the additional equipment mounting rail.

A strip of additional holes is tapped along a length of the additional equipment mounting rail (block 4614). In accordance with the principles discussed herein, the additional holes are tapped such that those holes are spaced according to the rack standard. By way of example, additional holes of a hole strip, similar to or the same as the hole strip 118, are tapped into the additional equipment mounting rail 116 such that the additional holes are spaced according to the rack standard. Like the holes of the hole strip 118, the additional holes are tapped such that when the bracket 104 is mounted to the mounting pair of rails (e.g., using the mounting edges 114 and the hole strips 112), an axis corresponding to the additional hole strip is substantially perpendicular to longitudinal axes of the mounting pair of rails. The axis that corresponds to the additional hole strip may extend substantially through (or substantially across) a length of the additional hole strip.

CONCLUSION

Although the apparatuses and techniques have been described in language specific to structural features and/or methodological acts, it is to be understood that the apparatuses and techniques defined in the appended claims are not necessarily limited to the specific features or acts described. Rather, the specific features and acts are disclosed as example forms of implementing the claimed subject matter.

What is claimed is:

1. A bracket that is mountable to a rack configured for mounting equipment and according to a rack standard that specifies how rails of the rack are disposed, one rail to another, and how a strip of holes disposed along a length of each rail is spaced, one hole relative to another, the bracket comprising:
   a pair of mounting edges configured to mount the bracket to a mounting pair of rails using hole strips of the mounting pair of rails; and
   an equipment mounting rail having a respective hole strip disposed along a length of the equipment mounting rail with holes spaced according to the rack standard, the equipment mounting rail disposed between the mounting edges such that when the bracket is mounted to the mounting pair of rails, the bracket is oriented horizontally in relation to ground on which the rack is deployed, wherein the respective hole strip is substantially perpendicular to holes of the pair of mounting edges, and the holes of the pair of mounting edges are spaced according to the rack standard.

2. The bracket of claim 1, wherein the rack standard is EIA-310.

3. The bracket of claim 1, wherein the respective hole strip of the equipment mounting rail is 10U of the holes spaced according to the rack standard.

4. The bracket of claim 1, wherein the respective hole strip is useable to mount rack mounted equipment in a substantially parallel orientation relative to longitudinal axes of the rails.

5. The bracket of claim 4, wherein the rack mounted equipment, when mounted to the respective hole strip of the equipment mounting rail, spans approximately 12U of hole strips of the mounting pair of rails.

6. The bracket of claim 4, wherein the respective hole strip is configured to be fastened with ears of the rack mounted equipment for mounting the rack mounted equipment to the equipment mounting rail.

7. The bracket of claim 1, further comprising a shelf that is integral with one or more of the pair of mounting edges or the equipment mounting rail and is configured to extend into the rack from the mounting pair of rails when the bracket is mounted to the mounting pair of rails.

8. The bracket of claim 1, wherein the hole strips of the mounting pair of rails are useable to mount rack mounted equipment in a substantially perpendicular orientation relative to longitudinal axes of the mounting pair of rails.

9. A method of forming a bracket that is mountable to a rack configured for mounting equipment and according to a rack standard that specifies how rails of the rack are disposed, one rail to another, and how a strip of holes disposed along a length of each rail is spaced, one hole relative to another, the method comprising:
   forming a pair of mounting edges configured to mount the bracket to a mounting pair of rails using hole strips of the mounting pair of rails;
   forming an equipment mounting rail of the bracket;
   disposing the equipment mounting rail between the mounting edges, and the equipment mounting rail configured for horizontal orientation in relation to ground on which the rack is deployed when the bracket is mounted to the rack; and
   tapping a respective strip of holes along a length of the equipment mounting rail such that holes of the respective strip of holes are spaced according to the rack standard, wherein the respective strip of holes is substantially perpendicular to strips of holes of the mounting edges, and holes of the strips of holes of the mounting edges are spaced according to the rack standard.

10. The method of claim 9, wherein the equipment mounting rail is disposed between the mounting edges such that when the bracket is mounted to the mounting pair of rails, an axis corresponding to the respective strip of holes is substantially perpendicular to longitudinal axes of the mounting pair of rails.

11. The method of claim 9, further comprising tapping the strips of holes into the mounting edges.

12. The method of claim 9, further comprising forming an additional equipment mounting rail of the bracket.

13. The method of claim 12, further comprising disposing the additional equipment mounting rail between the mounting edges.

14. The method of claim 13, further comprising tapping a respective strip of additional holes along a length of the additional equipment mounting rail such that holes of the respective strip of additional holes are spaced according to the rack standard.

15. The method of claim 14, wherein the additional equipment mounting rail is disposed between the mounting edges such that when the bracket is mounted to the mounting pair of rails, an additional axis corresponding to the respective strip of additional holes is substantially perpendicular to longitudinal axes of the mounting pair of rails.

16. The method of claim 9, wherein the respective strip of holes along the length of the equipment mounting rail is 10U of the holes spaced according to the rack standard.

17. The method of claim 9, wherein the respective strip of holes is useable to mount rack mounted equipment in a substantially parallel orientation relative to longitudinal axes of the rails.

18. A system comprising:
   a rack configured according to a rack standard; and
   a bracket that is mountable to the rack, the bracket comprising:
      a pair of mounting edges configured to mount the bracket to a mounting pair of rails of the rack using hole strips of the mounting pair of rails; and
      an equipment mounting rail having a respective hole strip disposed along a length of the equipment mounting rail with holes spaced according to the rack standard, the equipment mounting rail disposed between the mounting edges such that when the bracket is mounted to the mounting pair of rails, the bracket is oriented horizontally in relation to ground on which the rack is deployed, wherein the respective hole strip is substantially perpendicular to holes of the pair of mounting edges, and the holes of the pair of mounting edges are spaced according to the rack standard.

19. The system of claim 18, wherein the rack is one of a two-post relay rack having two rails or a four-post cabinet rack having four rails.

20. The system of claim 18, wherein:
- the bracket includes an additional equipment mounting rail having a respective additional hole strip disposed along a length of the additional equipment mounting rail with holes spaced according to the rack standard;
- the additional equipment mounting rail is disposed between the mounting edges such that when the bracket is mounted to the mounting pair of rails, both an axis corresponding to the respective hole strip of the equipment mounting rail and an additional axis corresponding to the respective additional hole strip of the additional equipment mounting rail are substantially perpendicular to longitudinal axes of the mounting pair of the rails; and
- the respective hole strip of the equipment mounting rail and the respective additional hole strip of the additional equipment mounting rail are useable to mount rack mounted equipment to the equipment mounting rail and the additional equipment mounting rail simultaneously and such that the rack mounted equipment is mounted in a substantially parallel orientation relative to the longitudinal axes of the rails.

* * * * *